(12) United States Patent
Wang et al.

(10) Patent No.: US 12,002,843 B2
(45) Date of Patent: Jun. 4, 2024

(54) DISPLAY PANEL AND DISPLAY DEVICE

(71) Applicant: Wuhan Tianma Micro-Electronics Co., Ltd., Wuhan (CN)

(72) Inventors: Meihong Wang, Wuhan (CN); Yangzhao Ma, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 544 days.

(21) Appl. No.: 17/378,138

(22) Filed: Jul. 16, 2021

(65) Prior Publication Data
US 2022/0336524 A1   Oct. 20, 2022

(30) Foreign Application Priority Data

Apr. 16, 2021   (CN) .......................... 202110414238.9

(51) Int. Cl.
*H01L 27/15* (2006.01)
*G09G 3/32* (2016.01)
*H01L 33/38* (2010.01)
*H01L 33/40* (2010.01)
*H01L 33/42* (2010.01)
*H01L 33/62* (2010.01)

(52) U.S. Cl.
CPC ............. *H01L 27/156* (2013.01); *G09G 3/32* (2013.01); *H01L 33/387* (2013.01); *H01L 33/405* (2013.01); *H01L 33/42* (2013.01); *H01L 33/62* (2013.01)

(58) Field of Classification Search
CPC ..... G09F 9/30; G09F 9/33; G09G 2300/0426; G09G 2320/0686; G09G 2340/0407; G06F 3/0445; G06F 2203/04108; H01L 25/0753; H01L 25/167; H01L 27/156; H01L 27/1214; H01L 33/382; H01L 33/405; H01L 33/42; H01L 33/387; H01L 33/62; H10K 59/1213; H10K 59/65; H10K 59/121; H10K 59/35; H10K 59/123; H10K 59/60; H10K 59/351; H10K 71/621

See application file for complete search history.

(56) References Cited

U.S. PATENT DOCUMENTS

2017/0345877 A1* 11/2017 Hwang ................ H10K 59/131
2019/0081122 A1*  3/2019 Kim .................... H10K 59/38
2019/0181211 A1*  6/2019 Bae .................... G09G 3/3225

(Continued)

*Primary Examiner* — Mark W Tornow
*Assistant Examiner* — Priya M Rampersaud
(74) *Attorney, Agent, or Firm* — von Briesen & Roper, s.c.

(57) ABSTRACT

Disclosed are a display panel and a display device. The display panel includes a display region, multiple pixels and a substrate. The display region includes an optical component region and a first display region. The multiple pixels include a first pixel and a second pixel, the first pixel includes a first light-emitting element located in the optical component region, and the second pixel includes a second light-emitting element located in the first display region. The optical component region includes an anode connecting line segment, the first light-emitting element includes a first anode, and the anode connecting line segment is electrically connected to the first anode; and in a direction perpendicular to a plane where the substrate is located, an area of the first anode is S1 and an electrical connection area of the first anode and the anode connecting line segment is S2, where 5%<S2/S1≤100%.

20 Claims, 23 Drawing Sheets

(56) References Cited

U.S. PATENT DOCUMENTS

| | | | |
|---|---|---|---|
| 2019/0189720 A1* | 6/2019 | Lim | H10K 59/131 |
| 2019/0288048 A1* | 9/2019 | Kang | H10K 59/1216 |
| 2021/0020716 A1* | 1/2021 | Kim | H10K 59/123 |
| 2022/0246687 A1* | 8/2022 | Lee | H10K 59/1216 |

* cited by examiner

DISPLAY PANEL AND DISPLAY DEVICE

CROSS-REFERENCE TO RELATED APPLICATIONS

This application claims priority to Chinese patent application No. 202110414238.9 filed with CNIPA on Apr. 16, 2021, the disclosure of which is incorporated herein by reference in its entirety.

TECHNICAL FIELD

Embodiments of the present disclosure relate to the field of display technologies and, in particular, a display panel and a display device.

BACKGROUND

With the development of electronic products, such as mobile phones including display panels and cameras, the requirements of people on these products not only have been limited to basic communication functions, but also turn to the aspects of design, artistry and good visual experiences. For example, electronic products with a high screen-to-body ratio are becoming more and more popular. The full screen has become an important development direction of electronic products. Earpieces, ambient light sensors, and proximity light sensors have all been successfully hidden under the screen, but the front-facing camera is difficult to hide.

In order to achieve the true full screen, the front-facing camera may be set under the screen. However, the full screen having the front-facing camera set under the screen brings many issues urgently to be solved.

SUMMARY

The present disclosure provides a display panel and a display device.

In an embodiment, the present disclosure provides a display panel. The display panel includes a display region, multiple pixels, multiple pixel driver circuits and a substrate.

The display region includes an optical component region and a first display region.

The multiple pixels include a first pixel and a second pixel, the first pixel includes a first light-emitting element, the second pixel includes a second light-emitting element, the first light-emitting element is located in the optical component region, and the second light-emitting element is located in the first display region.

The multiple pixel driver circuits include a first pixel driver circuit and a second pixel driver circuit, the first pixel driver circuit is electrically connected to the first light-emitting element, and the second pixel driver circuit is electrically connected to the second light-emitting element.

The optical component region includes an anode connecting line segment, the first light-emitting element includes a first anode, and the anode connecting line segment is electrically connected to the first anode; and in a direction perpendicular to a plane where the substrate is located, an area of the first anode is S1 and an electrical connection area of the first anode and the anode connecting line segment is S2, where $5\% < S2/S1 \leq 100\%$.

In an embodiment, the present disclosure further provides a display device including a display panel. The display panel includes a display region, multiple pixels, multiple pixel driver circuits and a substrate.

The display region includes an optical component region and a first display region.

The multiple pixels include a first pixel and a second pixel, the first pixel includes a first light-emitting element, the second pixel includes a second light-emitting element, the first light-emitting element is located in the optical component region, and the second light-emitting element is located in the first display region.

The multiple pixel driver circuits include a first pixel driver circuit and a second pixel driver circuit, the first pixel driver circuit is electrically connected to the first light-emitting element, and the second pixel driver circuit is electrically connected to the second light-emitting element.

The optical component region includes an anode connecting line segment, the first light-emitting element includes a first anode, and the anode connecting line segment is electrically connected to the first anode; and in a direction perpendicular to a plane where the substrate is located, an area of the first anode is S1 and an electrical connection area of the first anode and the anode connecting line segment is S2, where $5\% < S2/S1 \leq 100\%$.

According to the technical schemes provided by the present disclosure, it is set that $5\% < S2/S1 \leq 100\%$, where S1 is the area of the first anode, and S2 is the electrical connection area of the first anode and the anode connecting line segment, that is, the contact area of the first anode and the anode connecting line segment is increased. In this manner, when a via hole is relatively small and the resistance of the via hole region is relatively large, the static electricity transmitted by the anode connecting line segment is not difficult to be transmitted to the first anode. Therefore, the static electricity transmitted by the anode connecting line segment can be rapidly transmitted to the first anode, so that the static electricity on the anode connecting line segment is dissipated, and the electrostatic damage caused by the accumulation of the static electricity on the anode connecting line segment is prevented.

DETAILED DESCRIPTION

To make the objects, schemes and advantages of the present disclosure clearer, the technical schemes of the present disclosure will be completely described below in conjunction with exemplary implementations and drawings in the embodiments of the present disclosure. Apparently, the embodiments described below are part, not all, of the embodiments of the present disclosure. It is apparent for those skilled in the art that various modifications and variations may be made in the present disclosure without departing from the spirit or scope of the present disclosure. Accordingly, the present disclosure is intended to cover modifications and variations of the present disclosure that fall within the scope of the appended claims (the claimed technical schemes) and their equivalents.

It should be noted that the implementations of the present disclosure, if not in collision, may be combined with one another.

Figure 1:
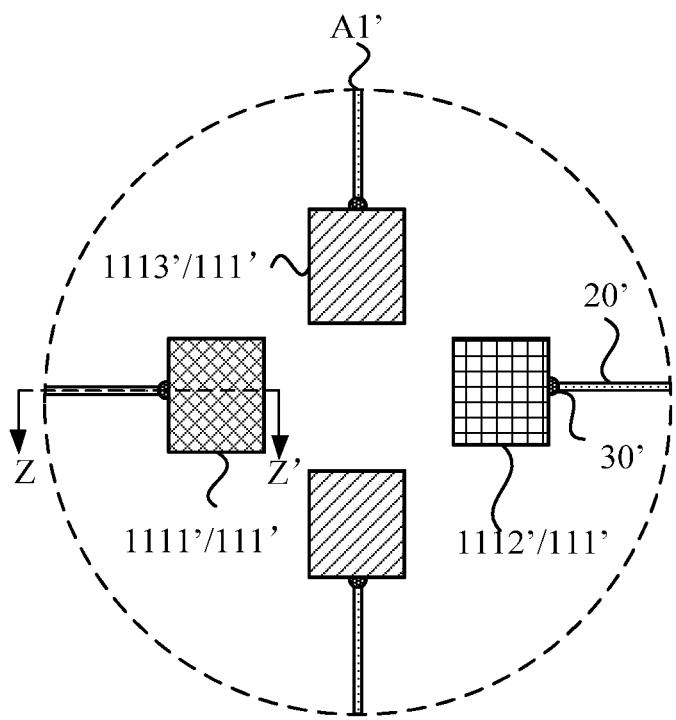
FIG. 1 is an enlarged partial structural view of a display panel in the related art.
Figure 2:
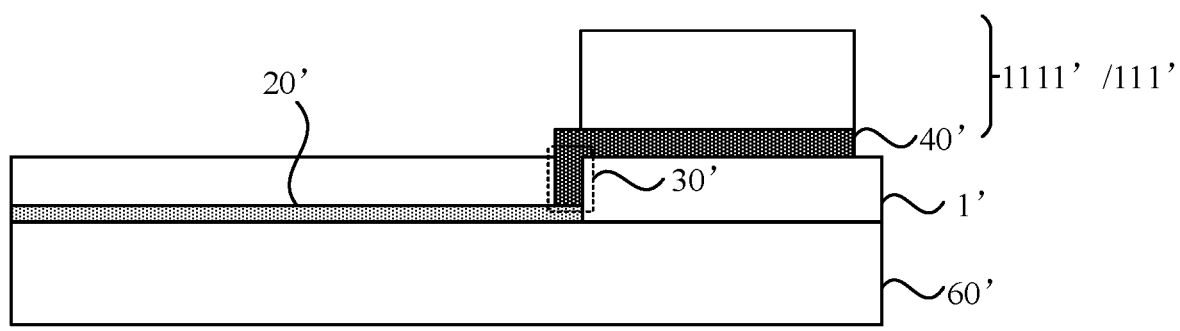
FIG. 2 is a sectional view taken along the direction ZZ' of FIG. 1.

FIG. 1 is an enlarged partial structural view of a display panel in the related art, and FIG. 2 is a sectional view taken along the direction ZZ' of FIG. 1. As shown in FIG. 1 and FIG. 2, an optical component region A1' corresponding to an optical component (not shown in the figures) includes multiple first light-emitting elements 111' and anode connecting line segments 20' on a substrate 60', and an insulating layer 1' is disposed between the anode connecting line segment 20' and a first anode 40' of the first light-emitting element 111'. The anode connecting line segment 20' is electrically connected to the first anode 40' of the first light-emitting element 111' through a via hole 30' provided in the insulating layer V. For example, drive signals may be provided for the first light-emitting element 111' through the anode connecting line segment 20' to drive the first light-emitting element 111' to emit light. The optical component may be correspondingly disposed in the optical component region A1', that is, the corresponding optical component may be disposed without increasing the bezel size of the display panel, in this manner, it is facilitated to narrow the bezels of the display panel, and the screen-to-body ratio of the display panel is improved. The optical component may include, for example, a front-facing camera, a fingerprint recognizer, a light sensor, a distance sensor, and/or an iris recognition sensor, etc. The first light-emitting element 111' may include a first light-emitting element 1111' emitting red light, a first light-emitting element 1112' emitting blue light, and a first light-emitting element 1113' emitting green light.

The inventors have found that since the resistance of the anode connecting line segment 20' and the resistance of the region of the via hole 30' vary, before signals transmitted on the anode connecting line segment 20' are transmitted to the first anode 40', the via hole 30' has a blocking effect on the signals transmitted by the anode connecting line segment 20'. For example, when the static electricity exists on the anode connecting line segment 20', the presence of the via hole 30' makes it difficult for the static electricity transmitted on the anode connecting line segment 20' to be transmitted to the first anode 40' of the first light-emitting element 111', that is, the static electricity cannot be rapidly dissipated, thus causing the anode connecting line segment 20' to be electrostatically damaged and thereby affecting the display of the first light-emitting elements 111'.

Based on the above, the inventors have further proposed technical schemes of the embodiments of the present disclosure. The embodiments of the present disclosure provide a display panel. The display panel includes a display region, multiple pixels, multiple pixel driver circuits and a substrate. The display region includes an optical component region and a first display region. The multiple pixels include a first pixel and a second pixel, the first pixel includes a first light-emitting element, the second pixel includes a second light-emitting element, the first light-emitting element is located in the optical component region, and the second light-emitting element is located in the first display region. The multiple pixel driver circuits include a first pixel driver circuit and a second pixel driver circuit, the first pixel driver circuit is electrically connected to the first light-emitting element, and the second pixel driver circuit is electrically connected to the second light-emitting element. The optical component region includes an anode connecting line segment, the first light-emitting element includes a first anode, and the anode connecting line segment is electrically connected to the first anode; and in a direction perpendicular to a plane where the substrate is located, an area of the first anode is S1 and an electrical connection area of the first anode and the anode connecting line segment is S2, where 5%<S2/S1≤100%.

According to the above technical schemes, it is set that 5%<S2/S1≤100%, where S1 is the area of the first anode, and S2 is the electrical connection area of the first anode and the anode connecting line segment, that is, the contact area of the first anode and the anode connecting line segment is increased. In this way, when a via hole is relatively small and the resistance of the via hole region is relatively large, the static electricity transmitted by the anode connecting line segment is not difficult to be transmitted to the first anode. Therefore, the static electricity transmitted by the anode connecting line segment can be rapidly transmitted to the first anode, thus the static electricity on the anode connecting line segment is dissipated, and the electrostatic damage caused by the accumulation of the static electricity on the anode connecting line segment is prevented.

The above is the core idea of the present disclosure. Technical schemes in the embodiments of the present disclosure will be described clearly and completely in conjunction with the drawings in the embodiments of the present disclosure.

Figure 3:
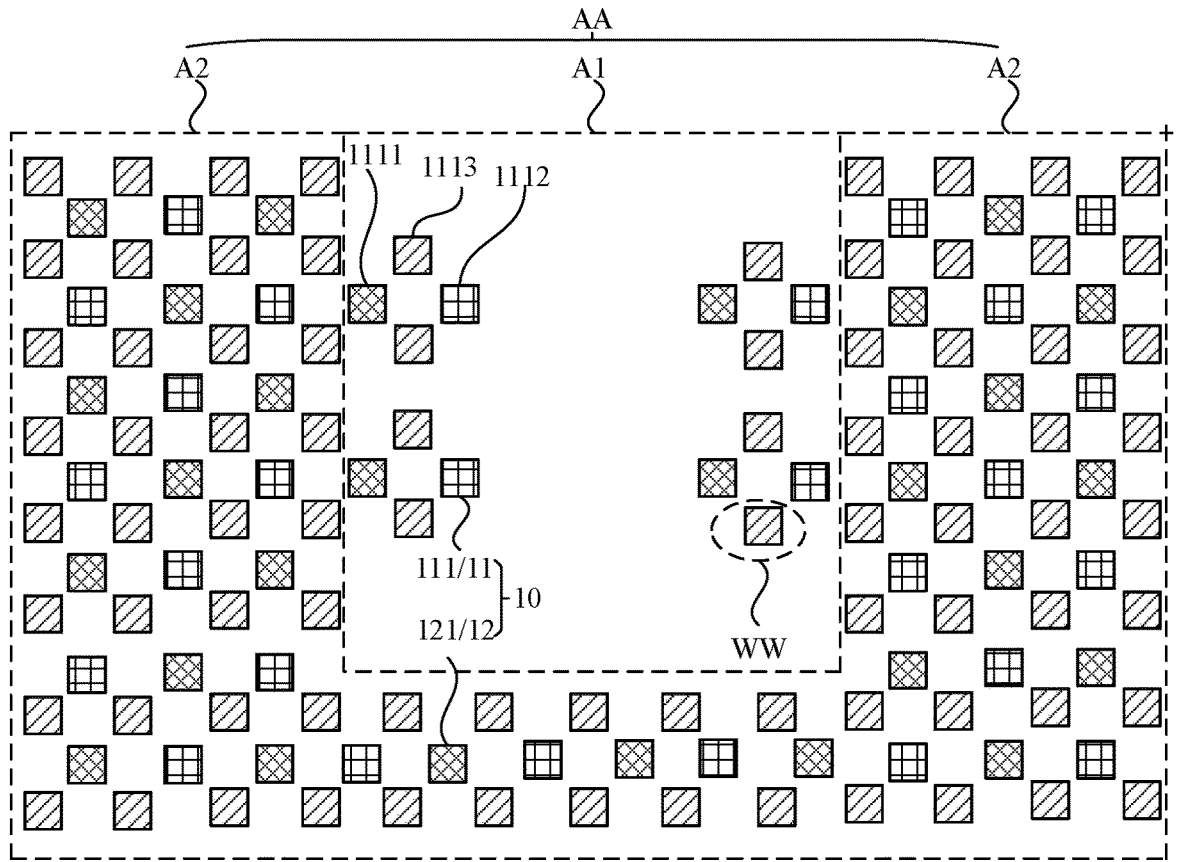
FIG. 3 is a structural view of a display panel according to an embodiment of the present disclosure.
Figure 4:
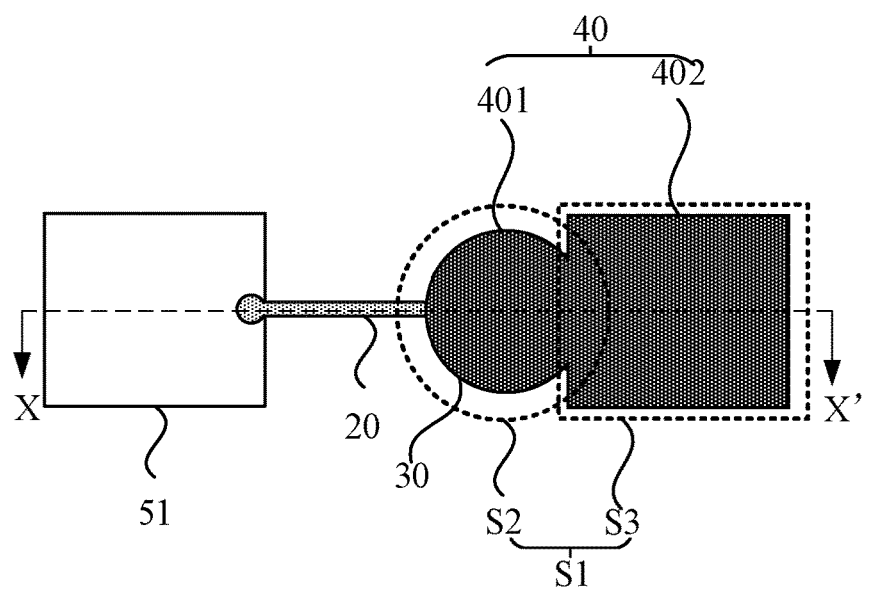
FIG. 4 is an enlarged partial view including the region WW in FIG. 3 according to an embodiment of the present disclosure.
Figure 5:
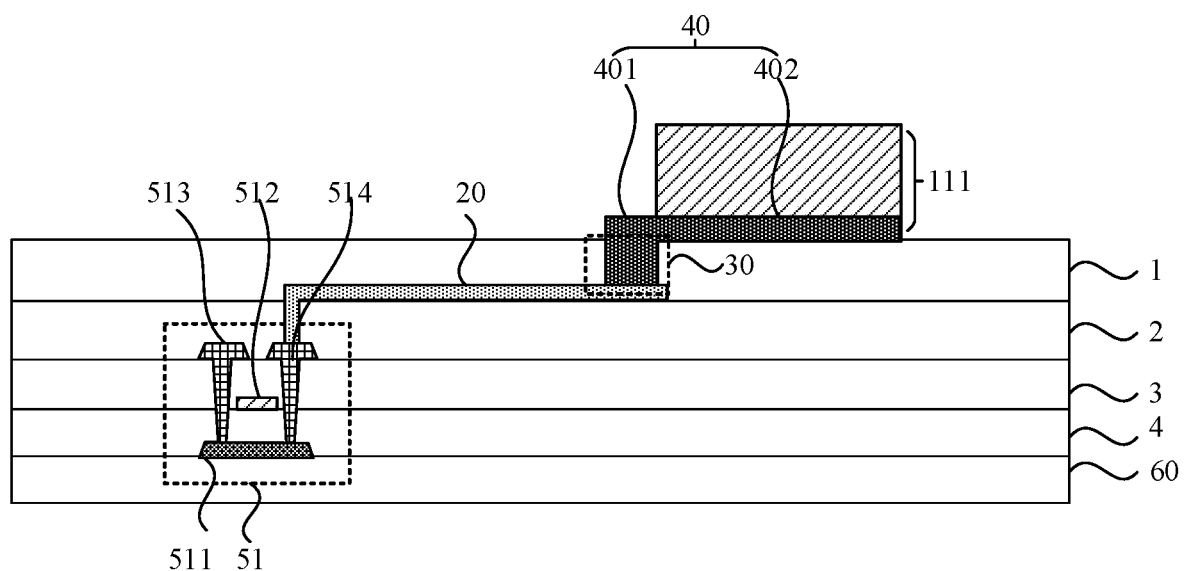
FIG. 5 is a sectional view taken along the direction XX' of FIG. 4.

FIG. 3 is a structural view of a display panel according to an embodiment of the present disclosure, FIG. 4 is an enlarged partial view including a region WW of FIG. 3 according to an embodiment of the present disclosure, and FIG. 5 is a sectional view taken along the direction XX' of FIG. 4. As shown in FIG. 3, a display panel 100 provided by the embodiment of the present disclosure includes a display region AA. The display region AA includes an optical component region A1 and a first display region A2, and the first display region A2 at least partially surrounds the optical component region A1. The first display region A2 at least partially surrounding the optical component region A1 may be that the optical component region A1 is located at an edge of the display region AA, thus the first display region A2 surrounds the optical component region A1 on three sides as shown in FIG. 3; alternatively, the optical component region A1 may be located at a corner of the display region AA, and thus the first display region A2 surrounds the optical component region A1 on two sides, which is not shown in the figures; alternatively, the first display region A2 may also surround the optical component region A1, and thus the first display region A2 surrounds the optical component region A1 on four sides, etc., which is not shown in the figures.

With continued reference to FIGS. 3, 4 and 5, the display region AA further includes multiple pixels 10 and multiple pixel driver circuits. The multiple pixels 10 include a first pixel 11 and a second pixel 12, the first pixel 11 includes a first light-emitting element 111, the second pixel includes a second light-emitting element 121, the first light-emitting element 111 is located in the optical component region A1, and the second light-emitting element 121 is located in the first display region A2. The multiple pixel driver circuits include a first pixel driver circuit 51 and a second pixel driver circuit (not shown in the figures), the first pixel driver circuit 51 is electrically connected to the first light-emitting element 111 to drive the first light-emitting element 111 to emit light, and the second pixel driver circuit is electrically connected to the second light-emitting element 121 to drive the second light-emitting element 121 to emit light. In this way, the optical component region A1 and the first display region A2 are both provided with light-emitting elements so that the optical component region A1 and the first display region A2 both can display and emit light, and the display panel 100 can truly achieve the full-screen display. The first light-emitting element 111 and the second light-emitting element 121, for example, may both include a first light-emitting element 1111 emitting red light, a first light-emitting element 1112 emitting blue light, and a first light-emitting element 1113 emitting green light to achieve the color display of the display panel 100. In an embodiment, the light transmittance of the optical component region A1 may be greater than the light transmittance of the first display region A2.

The display panel 100 further includes a substrate 60, the multiple pixels 10 and the multiple pixel driver circuits are all disposed on the substrate 60. The pixel driver circuits (the first pixel driver circuit 51 and the second pixel driver circuit) include, for example, at least one transistor, and the transistor may include, for example, an active layer 511, a gate electrode 512, a source electrode 513, and a drain electrode 514. The display panel 100 may further include, for example, an insulating layer 4 between the active layer 511 and the gate electrode 512, and an insulating layer 3 between the gate electrode 511 and the source electrode 513 as well as the drain electrode 514. The optical component region A1 includes an anode connecting line segment 20, the first light-emitting element 111 includes a first anode 40, and the anode connecting line segment 20 is electrically connected to the first anode 40. For example, the electrical connection between the anode connecting line segment 20 and the first anode 40 may be achieved through a via hole 30, that is, an insulating layer 1 is further disposed between the anode connecting line segment 20 and the first anode 40, and the insulating layer 1 may be provided with a via hole 30, referring to FIG. 5; alternatively, the electrical connection between the anode connecting line segment 20 and the first anode 40 may also be achieved in a contact manner, that is, the anode connecting line segment 20 directly contacts and is electrically connected to the first anode 40, which will be illustrated in detail in the following examples and is not repeated herein.

The first anode 40 may include, for example, an anode connecting portion 401 used for connecting the anode connecting line segment 20 and an anode main body portion 402 other than the anode connecting portion 401. In the direction perpendicular to the plane where the substrate 60 is located, an area of the first anode is S1, that is, the sum of an area S2 of the anode connecting portion 401 and an area S3 of the anode main body portion 402 other than the anode connecting portion 401; and an electrical connection area of the first anode 40 and the anode connecting line segment 20 is S2, that is, the area of the anode connecting portion 401. In the implementation, S1 and S2 satisfy that $5\% < S2/S1 \leq 100\%$.

Exemplarily, the electrical connection area S2 of the first anode 40 and the anode connecting line segment 20 is, for example, greater than 25 $\mu m^2$; the range of S3 is, for example, greater than or equal to 64 $\mu m^2$ and less than or equal to 400 $\mu m^2$. For example, the area S1 of the first anode 40 may be determined by measuring the area of the orthographic projection of the first anode 40 on the plane where the substrate 60 is located, and the area S2 of the anode connecting portion 401 may be determined by measuring the area of the projection of the anode connecting portion 401 on the plane where the substrate 60 is located; alternatively, the area S2 of the anode connecting portion 401 is determined by measuring the area of the orthographic projection of the anode connecting portion 401 on the plane where the substrate 60 is located, the area S3 of the anode main body portion 402 is determined by measuring the area of the orthographic projection of the anode main body portion 402 on the plane where the substrate 60 is located, and then the area S1 of the first anode 40 is calculated.

Exemplarily, S1 and S2 satisfy: $10\% \leq S2/S1 \leq 100\%$; or, $25\% \leq S2/S1 \leq 100\%$; or, $50\% \leq S2/S1 \leq 100\%$; or, $75\% \leq S2/S1 \leq 100\%$; or, $25\% \leq S2/S1 \leq 50\%$; or, $25\% \leq S2/S1 \leq 75\%$; or, $50\% \leq S2/S1 \leq 75\%$.

Exemplarily, with continued reference to FIG. 4 and FIG. 5, the electrical connection area S2 of the first anode 40 and the anode connecting line segment 20 is 100 μm, S3 is 300 μm, then S1 is 400 μm, and S2/S1 is equal to 25%.

Figure 6:
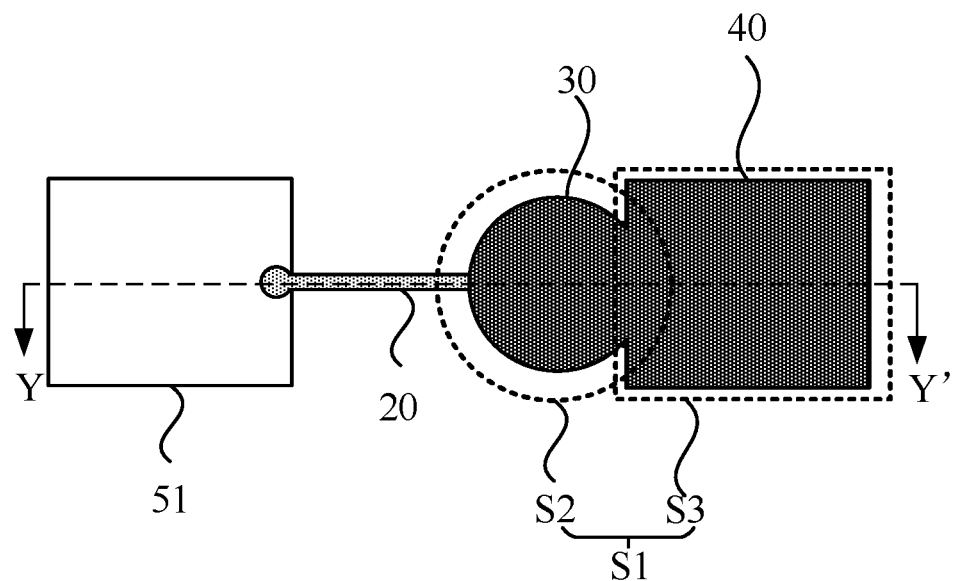
FIG. 6 is another enlarged partial view including the region WW in FIG. 3 according to an embodiment of the present disclosure.
Figure 7:
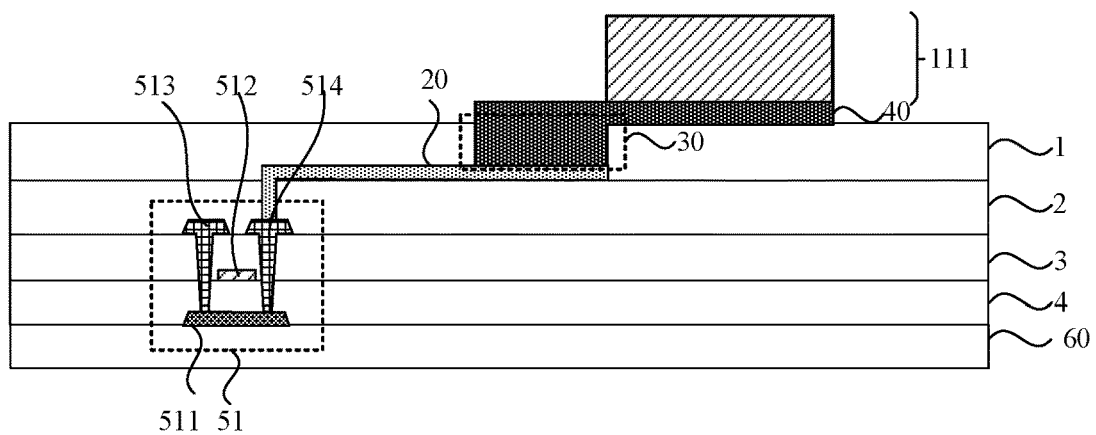
FIG. 7 is a sectional view taken along the direction YY' of FIG. 6.

Exemplarily, FIG. 6 is another enlarged partial view including the region WW in FIG. 3 according to an embodiment of the present disclosure, and FIG. 7 is a sectional view taken along the direction YY' of FIG. 6. Referring to FIG. 6 and FIG. 7, the electrical connection area S2 of the first anode 40 and the anode connecting line segment 20 is 200 μm, S3 is also 200 μm, then 51 is 400 μm, and S2/S1 is equal to 50%.

Figure 8:
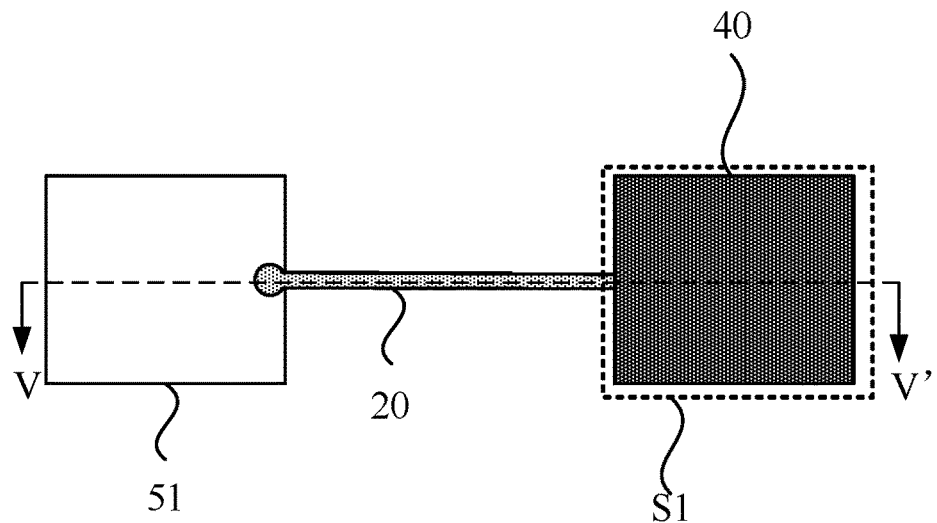
FIG. 8 is another enlarged partial view including the region WW in FIG. 3 according to an embodiment of the present disclosure.
Figure 9:
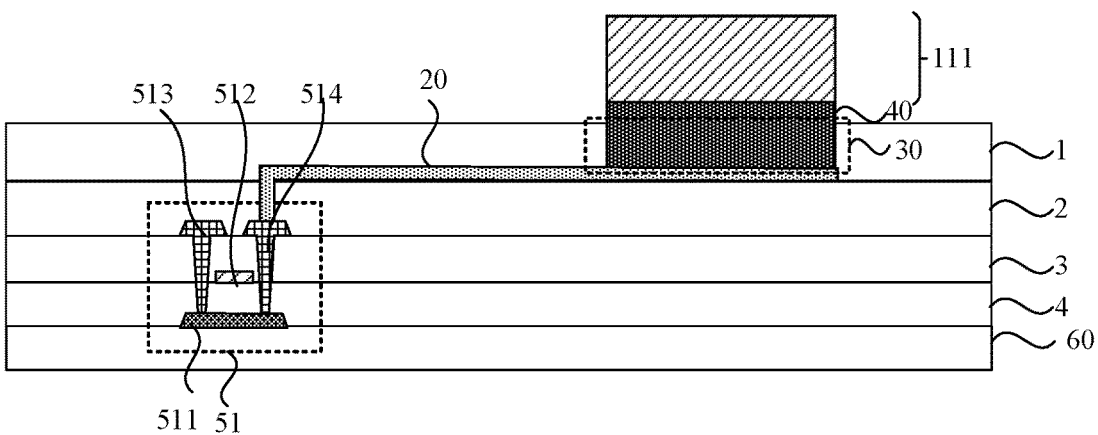
FIG. 9 is a sectional view taken along the direction VV' of FIG. 8.

Exemplarily, FIG. 8 is another enlarged partial view including the region WW in FIG. 3 according to an embodiment of the present disclosure, and FIG. 9 is a sectional view taken along the direction VV' of FIG. 8. Referring to FIG. 8 and FIG. 9, the entire first anode 40 contacts the anode connecting line segment 20. At this time, the contact area S2 of the first anode 40 and the anode connecting line segment 20 is the area 51 of the first anode 40, for example, 51 and S2 are both 400 μm, and S2/S1 is equal to 100%.

In the implementation, the ratio of the electrical connection area S2 of the first anode 40 and the anode connecting line segment 20 to 51 is increased, that is, the electrical connection area S2 of the first anode 40 and the anode connecting line segment 20 is relatively large. In this way, when the via hole is relatively small and the resistance of the via hole region is relatively large, the static electricity transmitted by the anode connecting line segment is not difficult to be transmitted to the first anode. Therefore, the static electricity transmitted by the anode connecting line segment 20 can be rapidly transmitted to the first anode 40, thus the static electricity on the anode connecting line segment 20 is dissipated, and the electrostatic damage caused by the accumulation of the static electricity on the anode connecting line segment 20 is prevented.

For example, the anode connecting line segment 20 located in the optical component region A1 may be set as a transparent trace so that the position where the anode connecting line segment 20 is disposed can also transmit light, the light transmission area of the optical component region A1 is increased, thus more light is transmitted through the optical component region A1 and received by an optical component disposed in the optical component region A1. Therefore, the photosensitivity of the optical component is improved.

For example, the anode connecting line segment 20 may be disposed in the same layer as the structure in the pixel driver circuit (the first pixel driver circuit 51 and/or the second pixel driver circuit). For example, the anode connecting line segment 20 is disposed in the same layer as the source electrode 513 and the drain electrode 514 of the transistor in the pixel driver circuit (not shown in the figures), or, the anode connecting line segment 20 is disposed in the same layer as the gate electrode 511 of the transistor (not shown in the figures), so as to simplify the process steps.

It should be noted that the display panel 100 in FIG. 3 is illustrated by taking the pixel density of the optical component region A1, that is, the density of light-emitting spots less than the pixel density of the first display region A2 as an example, but does not constitute a limitation of the present disclosure. The scheme of the present embodiments is also applicable to a display panel in which the pixel density of the optical component region A1 is the same as the pixel density of the first display region A2.

It is to be understood that in FIGS. 4, 6 and 8, in order to clearly show the area S1 of the first anode 40 of the first light-emitting element 111 and the electrical connection area S2 of the first anode 40 and the anode connecting line segment 20, only the first anode 40 of the first light-emitting element 111 is shown and other film layers of the first light-emitting element 111 are not shown. Setting in the following embodiments is also the same as the configuration described above. Repetition will not be made herein.

It should be noted that when the anode connecting line segment 20 is electrically connected to the first anode 40, the position where the first pixel driver circuit 51 is located may include the following two types: in a first type, the first pixel driver circuit 51 is located in the optical component region A1; in a second type, the first pixel driver circuit 51 is not located in the optical component region A1. Exemplarily, the display region AA further includes a second display region, the second display region is located between the optical component region A1 and the first display region A2, and the first pixel driver circuit may be located in the second display region. This manner will be described in detail in the following embodiments and will not be repeated herein. It should be noted that when the anode connecting line segment 20 is electrically connected to the first anode 40, the position where the first pixel driver circuit 51 is located includes, but is not limited to, the above two examples, and the position where the first pixel driver circuit 51 is located may be flexibly set according to the region division of the display panel.

The first pixel driver circuit 51 may be electrically connected to the first anode 40 through the anode connecting line segment 20.

Exemplarily, with continued reference to FIGS. 3 to 5, an insulating layer 2 is disposed between the first pixel driver circuit 51 and the anode connecting line segment 20. The first pixel driver circuit 51 may be electrically connected to one terminal of the anode connecting line segment 20 through a via hole in the insulating layer 2, and the other terminal of the anode connecting line segment 20 is electrically connected to the first anode 40. With continued reference to FIGS. 3 to 5, the first pixel driver circuit 51 and the first light-emitting element 111 are both located in the optical component region A1, but the first pixel driver circuit 51 is not located under the first light-emitting element 111, and in the direction perpendicular to the plane where the substrate 60 is located, the first pixel driver circuit 51 is located at a distance from the first anode 40. For example, first pixel driver circuits 51 corresponding to different first light-emitting elements 111 are intensively disposed at one or more positions of the optical component region A1, for example, intensively disposed at a central region of the optical component region A1. At this time, the first pixel driver circuit 51 may be electrically connected to the first anode 40 of the first light-emitting element 111 corresponding to the first pixel driver circuit 51 through the anode connecting line segment 20. For example, the drive current generated by the first pixel driver circuit 51 may be transmitted to the first light-emitting element 111 through the anode connecting line segment 20 to drive the first light-emitting element 111 to emit light. The advantage of this manner is that since the optical component region A1 other than the central region is not provided with the first pixel driver circuit 51, the corresponding region does not have the diffraction caused by gaps between the metal structures in the first pixel driver circuit 51; and in the central region, the first pixel driver circuits 51 are intensively disposed, that is, the metal structures in the first pixel driver circuits 51 are closely arranged, so that the diffraction caused by the gaps between the metal structures in the first pixel driver circuits 51 can also be solved.

The first pixel 11 may further include at least one third light-emitting element, the at least one third light-emitting element includes a third anode, and the third anode is electrically connected to the first anode.

Figure 10:
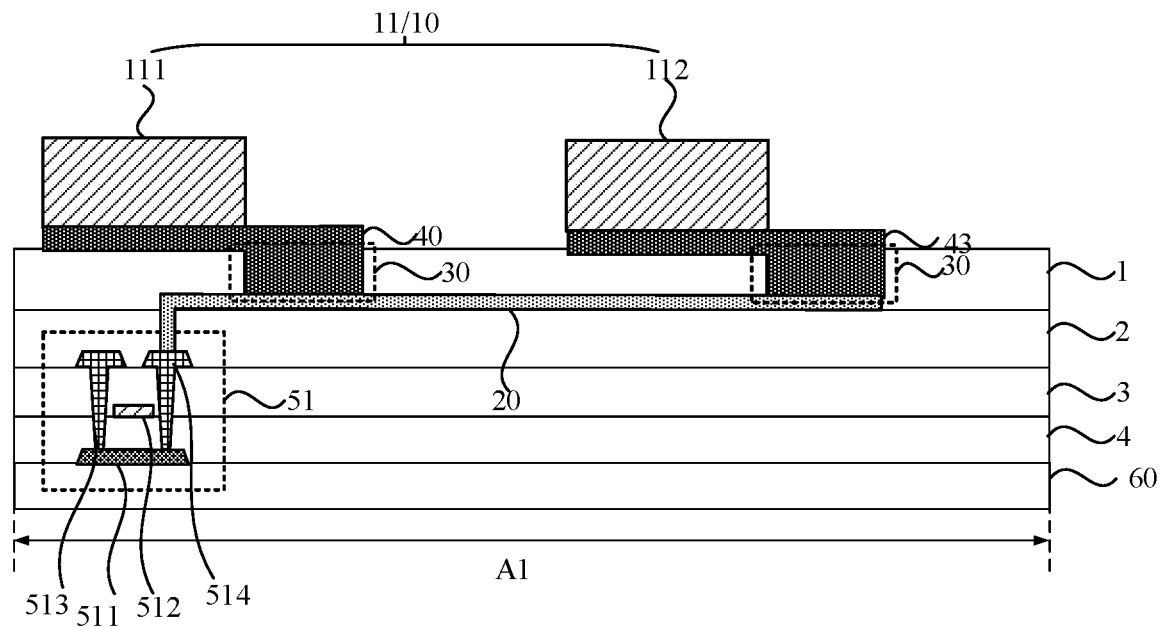
FIG. 10 is a structural view of part of film layers of a display panel according to an embodiment of the present disclosure.

FIG. 10 is a structural view of part of film layers of a display panel according to an embodiment of the present disclosure. As shown in FIG. 10, the first pixel 11 further includes at least one third light-emitting element 112. The first pixel 11 including one third light-emitting element 112 is taken as an example and illustrated in FIG. 10. With continued reference to FIG. 10, the third light-emitting element 112 includes a third anode 43, and the third anode 43 is electrically connected to the first anode 40 through the anode connecting line segment 20. The first pixel driver circuit 51 may simultaneously drive the first light-emitting element 111 and the third light-emitting element 112 to enable the first light-emitting element 111 and the third light-emitting element 112 to emit light.

In the implementation, the first anode 40 and the third anode 43 are electrically connected through the anode connecting line segment 20 so that at least two light-emitting elements (one first light-emitting element 111 and at least one third light-emitting element 112) can be driven by one first pixel driver circuit 51 to emit light, so as to reduce the number of first pixel driver circuits 51, further reduce the area of the optical component region A1 occupied by the first pixel driver circuits 51, and increase the light transmission area of the optical component region A1. Moreover, at least two light-emitting elements are driven by one first pixel driver circuit 51 to emit light, the pixel current of the first pixel 11 can be reduced, and the lifetime of the light-emitting elements in the optical component region A1 can be improved. In an embodiment, in the direction perpendicular to the plane where the substrate 60 is located, the first pixel driver circuit 51 may be located under the first light-emitting element 111, and the third light-emitting element 112 is located at a distance from the first pixel driver circuit 51.

Figure 11:
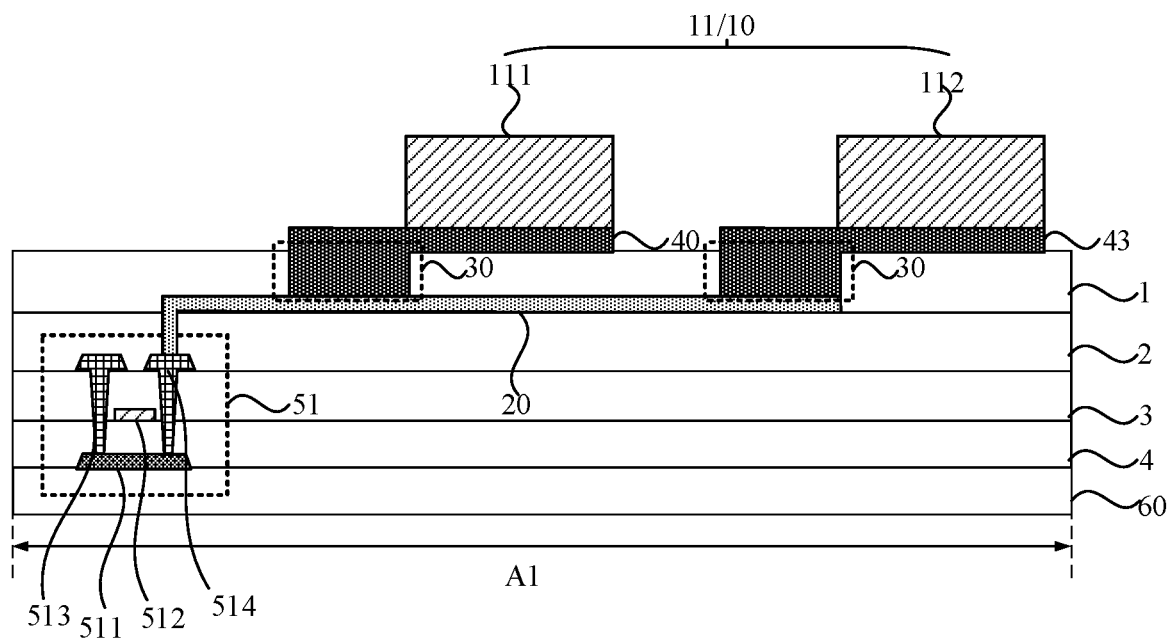
FIG. 11 is another structural view of part of film layers of a display panel according to an embodiment of the present disclosure.

It should be noted that when the first pixel driver circuit 51 is located in the optical component region A1 and under the light-emitting element, the first pixel 11 may further include at least one third light-emitting element 112. When the first pixel driver circuit 51 is located in the optical component region A1 but not under the light-emitting element, the first pixel 11 may also include at least one third light-emitting element 112. For example, referring to FIG. 11, the anode connecting line segment 20 may be used not only to electrically connect the first driver pixel circuit 51 and the first light-emitting element 111, that is, the first driver pixel circuit 51 provides the drive current for the first light-emitting element 111 through the anode connecting line segment 20, but also to connect the third light-emitting element 112 and the first light-emitting element 111, so that the drive current is transmitted through the anode connecting line segment 20 to the third light-emitting element 112 to drive the third light-emitting element 112 to emit light. Thus, the first pixel driver circuit 51 corresponding to each first light-emitting element 111 can be intensively disposed, the diffraction is avoided, and the light transmission area of the optical component region A1 is also increased. Meanwhile, at least two light-emitting elements are driven to emit light by one first pixel driver circuit 51 so that the pixel current of the first pixel 11 can also be reduced, and the lifetime of the light-emitting elements in the optical component region A1 can be improved.

Referring to the above content, the embodiments of the present disclosure exemplarily illustrate the situation where the first pixel driver circuit 51 is located in the optical component region A1, and the anode connecting line segment is electrically connected to the first anode 40. As can be seen from the above examples, when the first pixel driver circuit 51 is located in the optical component region A1 and the anode connecting line segment 20 is electrically connected to the first anode 40, the ratio of the electrical connection area S2 of the first anode 40 and the anode connecting line segment 20 to S1 satisfy that 5%<S2/S1≤100%, that is, the ratio of the electrical connection area S2 of the first anode 40 and the anode connecting line segment 20 to S1 is increased, i.e., the electrical connection area S2 of the first anode 40 and the anode connecting line segment 20 is relatively large. In this way, when the via hole is relatively small and the resistance of the via hole region is relatively large, the static electricity transmitted by the anode connecting line segment is not difficult to be transmitted to the first anode. Therefore, the static electricity transmitted by the anode connecting line segment 20 can be rapidly transmitted to the first anode 40, thus the static electricity on the anode connecting line segment 20 is dissipated, and the electrostatic damage caused by the accumulation of the static electricity on the anode connecting line segment 20 is prevented.

Figure 12:
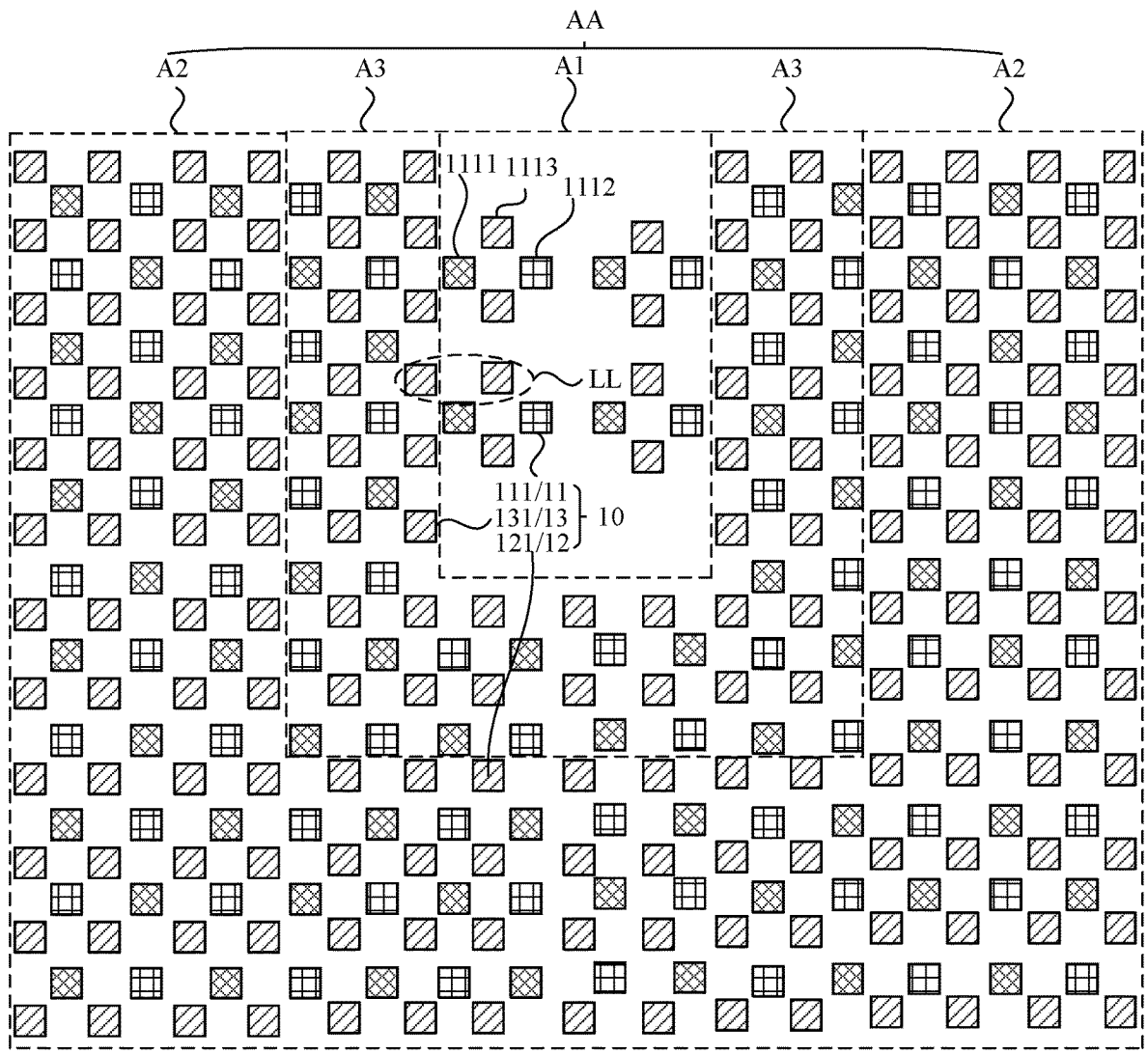
FIG. 12 is another structural view of a display panel according to an embodiment of the present disclosure.
Figure 13:
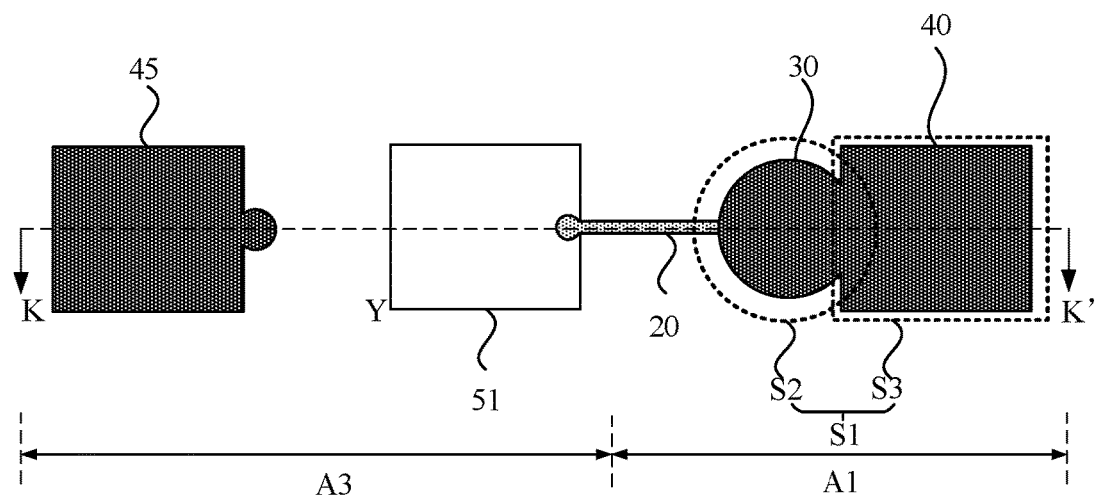
FIG. 13 is an enlarged partial view including the region LL in FIG. 12 according to an embodiment of the present disclosure.
Figure 14:
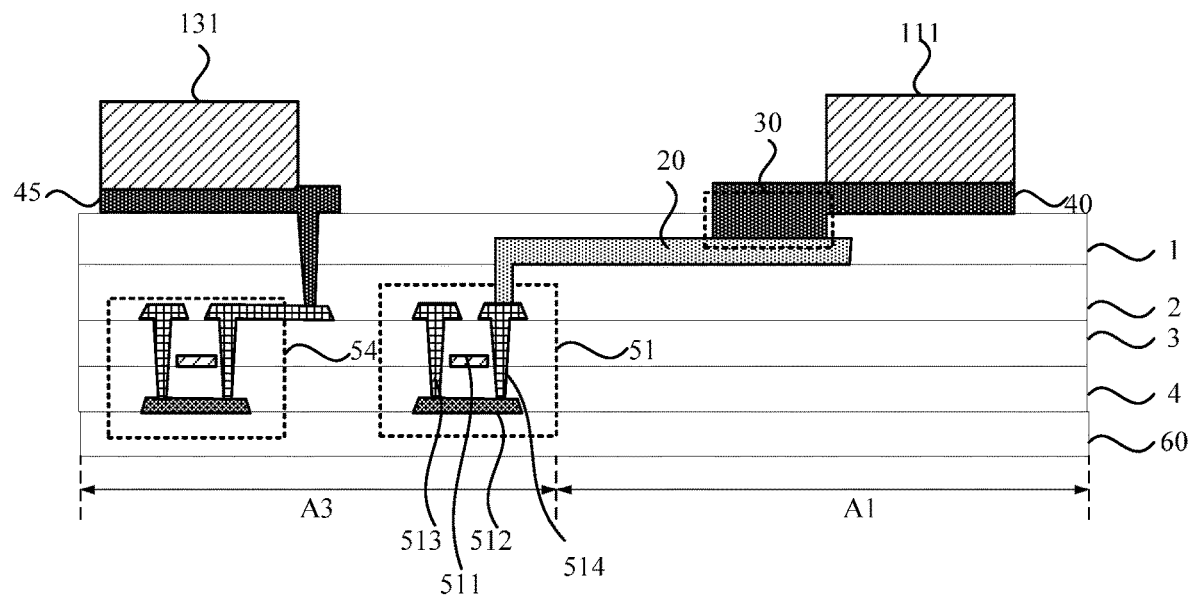
FIG. 14 is a sectional view taken along the direction KK' of FIG. 13.

FIG. 12 is another structural view of a display panel according to an embodiment of the present disclosure, FIG. 13 is an enlarged partial view including a region LL in FIG. 12 according to an embodiment of the present disclosure, and FIG. 14 is a sectional view taken along the direction KK' of FIG. 13. As shown in FIGS. 12, 13 and 14, the display region AA further includes a second display region A3, the second display region A3 is located between the optical component region A1 and the first display region A2, and the first pixel driver circuit 51 is located in the second display region A3. Through disposing the first pixel driver circuit 51 in the second display region A3 adjacent to the optical component region A1, the position where the first pixel driver circuit 51 is originally disposed can also transmit light, the light transmission area of the optical component region A1 is increased, and thus more light is transmitted through the optical component region A1 and received by an optical component disposed in the optical component region A1. Therefore, the performance of the optical component is improved. The first pixel driver circuit 51 is not located under the first light-emitting element 111, and in the direction perpendicular to the plane where the substrate 60 is located, the first pixel driver circuit 51 is located at a distance from the first anode 40. At this time, the first pixel driver circuit 51, for example, may be electrically connected to the first anode 40 of the first light-emitting element 111 corresponding to the first pixel driver circuit 51 through the anode connecting line segment 20. For example, the drive current generated by the first pixel driver circuit 51 may be transmitted to the first light-emitting element 111 through the anode connecting line segment 20 to drive the first light-emitting element 111 to emit light.

With continued reference to FIGS. 12, 13 and 14, the pixel 10 may further include a third pixel 13, and the third pixel 13 includes a fourth light-emitting element 131. The pixel driver circuits further include a third pixel driver circuit 54. The fourth light-emitting element 131 and the third pixel driver circuit 54 are located in the second display region A3, and the third pixel driver circuit 54 is electrically connected to a fourth anode 45 of the fourth light-emitting element 131 through a via hole.

In an embodiment, a third display region (not shown in the figures) is further disposed between the second display region A3 and the first display region A2. The pixel density of the third display region may be greater than the pixel density of the second display region but less than the pixel density of the first display region, so as to achieve the improvement of optimizing the display effect of the display panel.

Figure 15:
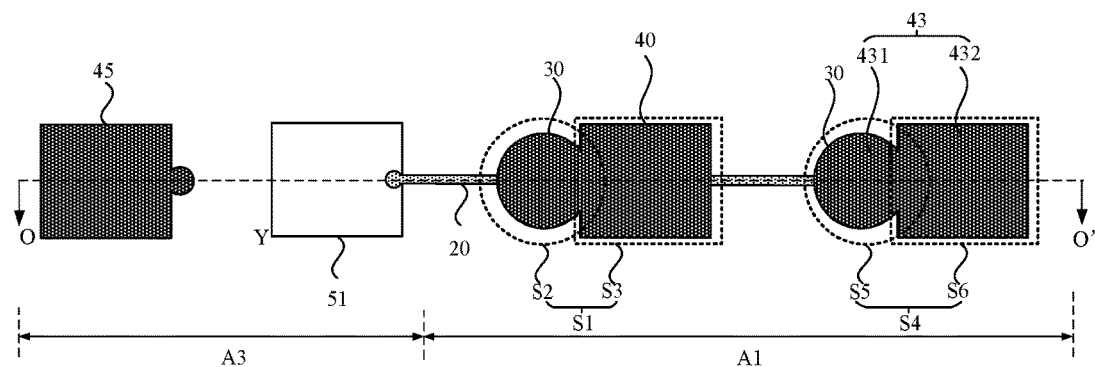
FIG. 15 is a partial top structural view of a display panel according to an embodiment of the present disclosure.
Figure 16:
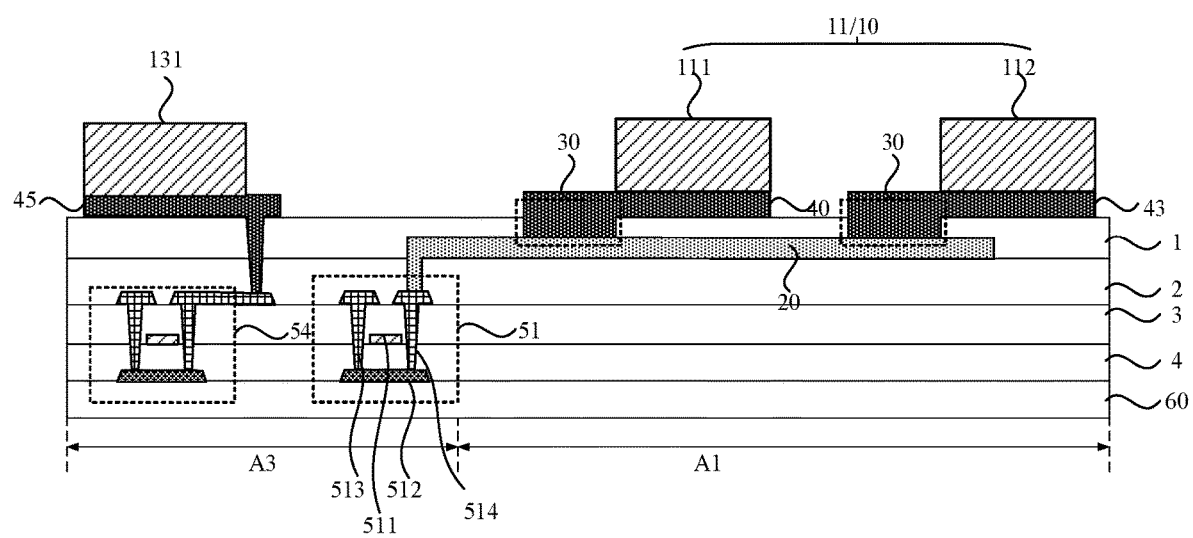
FIG. 16 is a sectional view taken along the direction OO' of FIG. 15.
Figure 17:
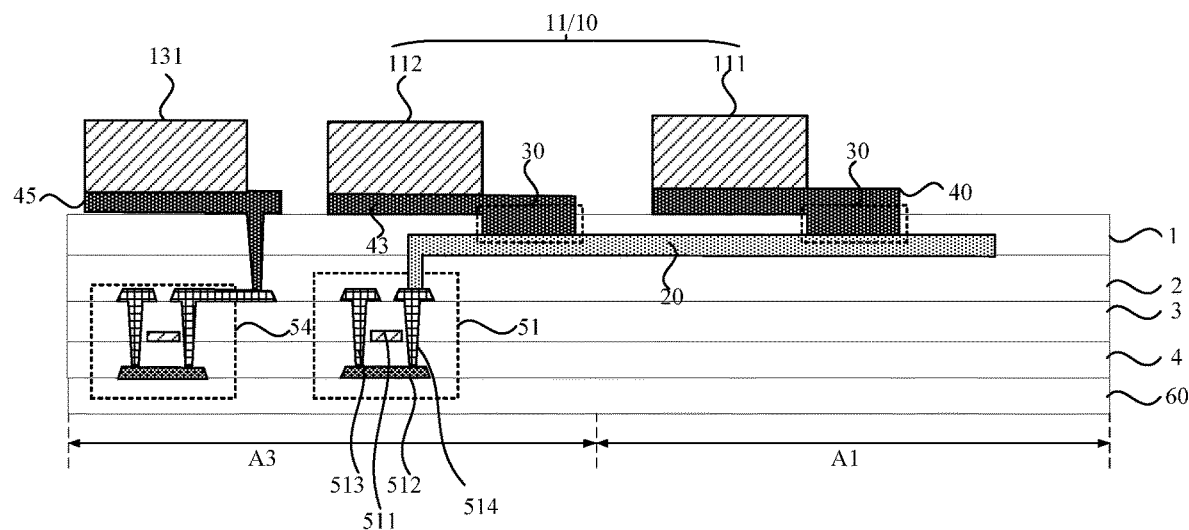
FIG. 17 is another structural view of part of film layers of a display panel according to an embodiment of the present disclosure.
Figure 18:
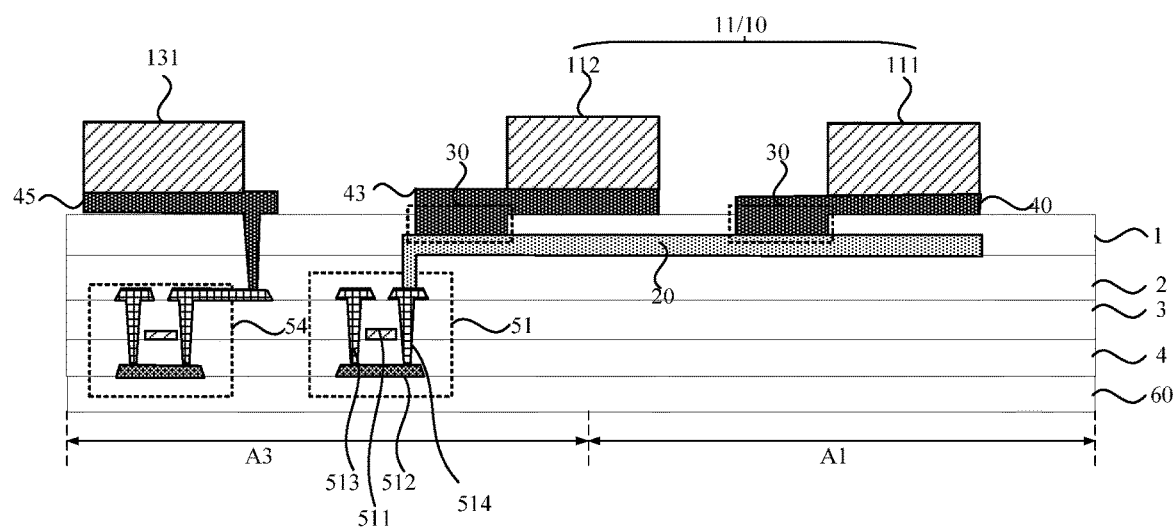
FIG. 18 is another structural view of part of film layers of a display panel according to an embodiment of the present disclosure.

FIG. 15 is a partial top structural view of a display panel according to an embodiment of the present disclosure, and FIG. 16 is a sectional view taken along the direction OO' of FIG. 15. As shown in FIG. 15 and FIG. 16, the first pixel 11 further includes at least one third light-emitting element 112, the at least one third light-emitting element 112 includes a third anode 43, and the third anode 43 is electrically connected to the first anode 40. When the first pixel driver circuit 51 is located in the second display region A3, the first pixel driver circuit 51 may simultaneously drive the first light-emitting element 111 to emit light and the third light-emitting element 112 to emit light. The third anode 43 may be located in the optical component region A1, that is, the third light-emitting element 112 is located in the optical component region A1, referring to FIG. 15 and FIG. 16; alternatively, the third anode 43 is located in the second display region A3, that is, the third light-emitting element 112 is located in the second display region A3, referring to FIG. 17; alternatively, the third anode 34 is located in both the optical component region A1 and the second display region A3, that is, the third light-emitting element 112 is located at the interface of the optical component region A1 and the second display region A3, referring to FIG. 18.

In the embodiment, the first pixel driver circuit 51 is disposed in the second display region A3 adjacent to the optical component region A1 so that the position where the first pixel driver circuit 51 is originally disposed can also transmit light, the light transmission area of the optical component region A1 is increased, thus more light is transmitted through the optical component region A1 and received by an optical component disposed in the optical component region A1. Therefore, the photosensitivity of the optical component is improved. Moreover, at least two light-emitting elements (one first light-emitting element 111 and at least one third light-emitting element 112) are driven by one first pixel driver circuit 51 to emit light, the pixel current of the first pixel 11 can be reduced, and the lifetime of the light-emitting elements in the optical component region A1 can be improved.

Referring to the above content, the embodiments of the present disclosure exemplarily illustrate the situation where the first pixel driver circuit 51 is located in the second display region A3. It can be seen from the above illustration that when the first pixel driver circuit 51 is located in the second display region A3, the light transmission area of the optical component region A1 can be increased, thus more light is transmitted through the optical component region A1 and received by the optical component disposed in the optical component region A1. Therefore, the photosensitivity of the optical component is improved.

In summary, when the anode connecting line segment is electrically connected to the first node, it may be set that 5%<S2/S1≤100%, where S1 is the area of the first anode, and S2 is the electrical connection area of the first anode and the anode connecting line segment, that is, the contact area of the first anode and the anode connecting line segment is increased. In this way, when the via hole is relatively small and the resistance of the via hole region is relatively large, the static electricity transmitted by the anode connecting line segment is not difficult to be transmitted to the first anode. Therefore, the static electricity transmitted by the anode connecting line segment can be rapidly transmitted to the first anode, thus the static electricity on the anode connecting line segment is dissipated, and the electrostatic damage caused by the accumulation of the static electricity on the anode connecting line segment is prevented.

It should be noted that in the above embodiments, when the first pixel 11 further includes at least one third light-emitting element 112, and the third anode 43 of the third light-emitting element 112 is electrically connected to the anode connecting line segment 20, it may be set that 5%<S5/S4≤100%, where S4 is the area of the third anode 43, and S5 is the electrical connection area of the third anode 43 and the anode connecting line segment 20. Exemplarily, with continued reference to FIG. 15, the third anode 43 includes a connecting portion 431 used for connecting the anode connecting line segment 20 and a main body portion 432 other than the connecting portion 431, and the area S4 of the third anode 43 is equal to the sum of the area S5 of the connecting portion 431 and the area S6 of the main body portion 432 other than the connecting portion 431. For example, the area S4 of the third anode 43 is determined by measuring the area of the orthographic projection of the third anode 43 on the plane where the substrate 60 is located, and the area S5 of the connecting portion 431 is determined by measuring the area of the orthographic projection of the connecting portion 431 on the plane where the substrate 60 is located; alternatively, the area S5 of the connecting portion 431 is determined by measuring the area of the orthographic projection of the connecting portion 431 on the plane where the substrate 60 is located, the area S6 of the body portion 432 is determined by measuring the area of the orthographic projection of the body portion 432 on the plane where the substrate 60 is located, and then the area S4 of the third anode 43 is calculated. In the implementation, S4 and S5 satisfy that 5%<S5/S4≤100%, that is, the contact area of the third anode 43 and the anode connecting line segment 20 is increased. In this way, when the via hole is relatively small and the resistance of the via hole region is relatively large, the static electricity transmitted by the anode connecting line segment 20 is not difficult to be transmitted to the third anode 43. Therefore, the static electricity transmitted by the anode connecting line segment 20 can be rapidly transmitted to the third anode 43, that is, the static electricity on the anode connecting line segment 20 can be dissipated through the third anode 43, and the electrostatic damage caused by the accumulation of the static electricity on the anode connecting line segment 20 is further prevented. It should be noted that the relationship satisfied by S4 and S5 is illustrated in the implementation by taking the third light-emitting element 112 located in the optical component region A1 as an example, and the situation where the third light-emitting element 112 is located in the second display region A3, or the third light-emitting element 112 is located at the interface of the optical component region A1 and the second display region A3 is also applicable to the present scheme.

It should be noted that the anode connecting line segment 20 is electrically connected to the first anode 40 refers to that the electrical connection between the anode connecting line segment 20 and the first anode 40 may be achieved through a via hole; and the electrical connection between the anode connecting line segment 20 and the first anode 40 may also be achieved in a contact manner, that is, the anode connecting line segment 20 directly contacts and is electrically connected to the first anode 40. The situation where the anode connecting line segment 20 directly contacts and is electrically connected to the first anode 40 is illustrated below. In order to more conveniently and clearly describe the follow-up schemes, the first pixel driving circuit 51 located in the optical component region A1 but not below the light-emitting element is taken as an example for illustration. The following content does not belong to the limitation of the present disclosure.

Figure 19:
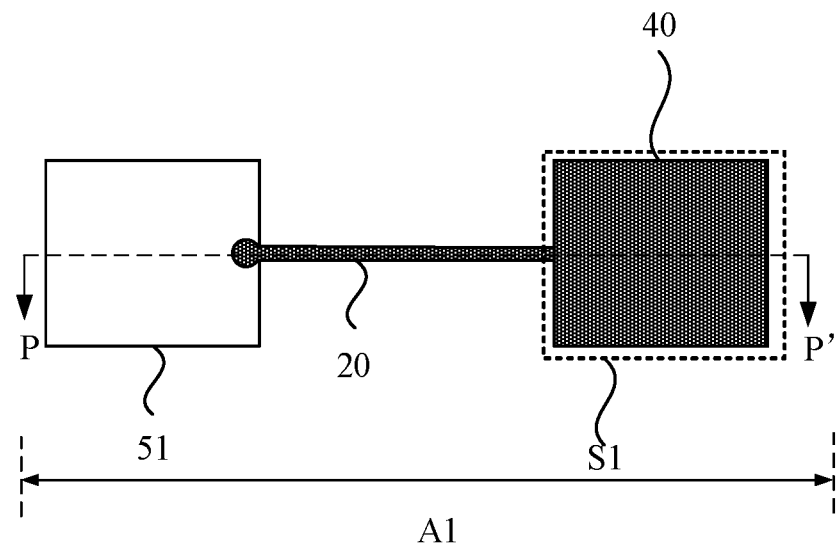
FIG. 19 is another enlarged partial view including the region WW in FIG. 3 according to an embodiment of the present disclosure.
Figure 20:
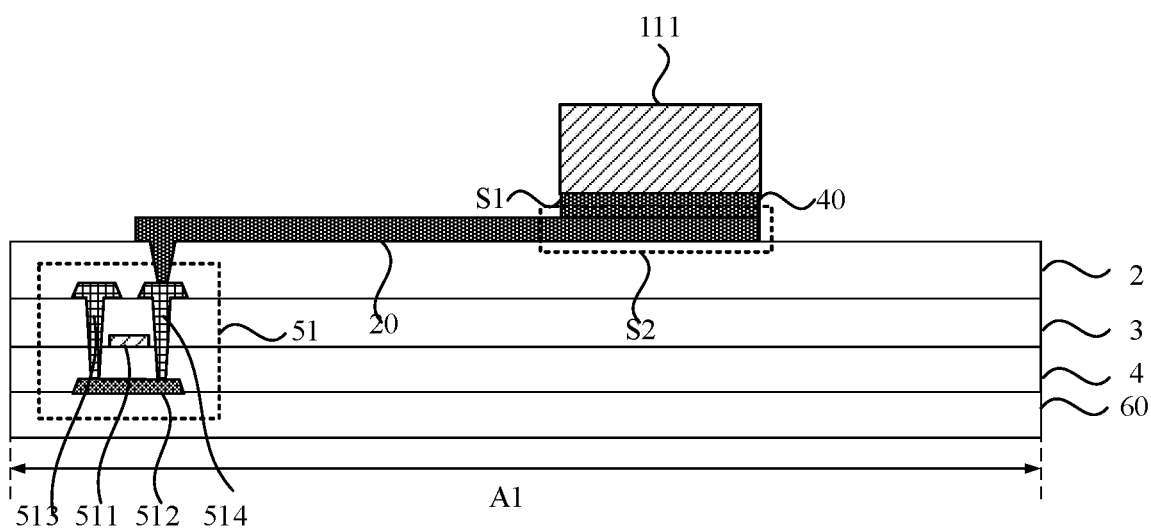
FIG. 20 is a sectional view taken along the direction PP' of FIG. 19 according to an embodiment of the present disclosure.

On the basis of the above implementations, FIG. 19 is another enlarged partial view including the region WW in FIG. 3 according to an embodiment of the present disclosure; and FIG. 20 is a sectional view taken along the direction PP' of FIG. 19 according to an embodiment of the present disclosure. As shown in FIG. 19 and FIG. 20, the anode connecting line segment 20 directly contacts and is electrically connected to the first anode 40. In an embodiment, the electrical connection area S2 of the first anode 40 and the anode connecting line segment 20 may be equal to the area S1 of the first anode 40, that is, S2/S1=100%.

In the implementation, the anode connecting line segment 20 directly contacts and is electrically connected to the first anode 40, that is, no via hole exists. In this way, the static electricity on the anode connecting line segment 20 can be directly transmitted to the first anode 40, avoiding that when the via hole is relatively small and the resistance of the via hole region is relatively large, the static electricity transmitted by the anode connecting line segment 20 is difficult to be transmitted to the first anode 40. Therefore, the static electricity transmitted by the anode connecting line segment 20 can be rapidly transmitted to the first anode 40, thus the static electricity on the anode connecting line segment 20 is dissipated, and the electrostatic damage caused by the accumulation of the static electricity on the anode connecting line segment 20 is prevented. Moreover, since the anode connecting line segment 20 directly contacts and is electrically connected to the first anode 40, no via hole exists, the hole-digging is not required, so that the number of mask plates is reduced, the process steps are simplified, and the manufacturing efficiency of the display panel is improved.

It should be noted that the case where S2/S1=100% is not only applicable to the situation where the first pixel driver circuit 51 is disposed in the optical component region A1, but also applicable to the case where the first pixel driver circuit is not disposed in the optical component region A1. For example, the first pixel driver circuit 51 is disposed in the second display region A3, as shown in FIG. 21.

Figure 21:
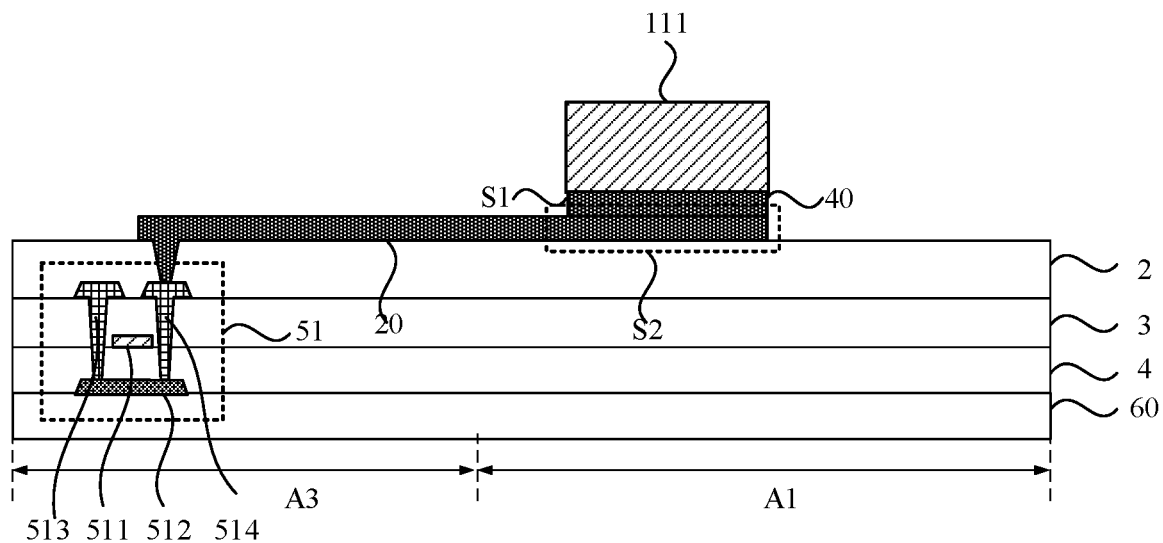
FIG. 21 is another structural view of part of film layers of a display panel according to an embodiment of the present disclosure.
Figure 22:
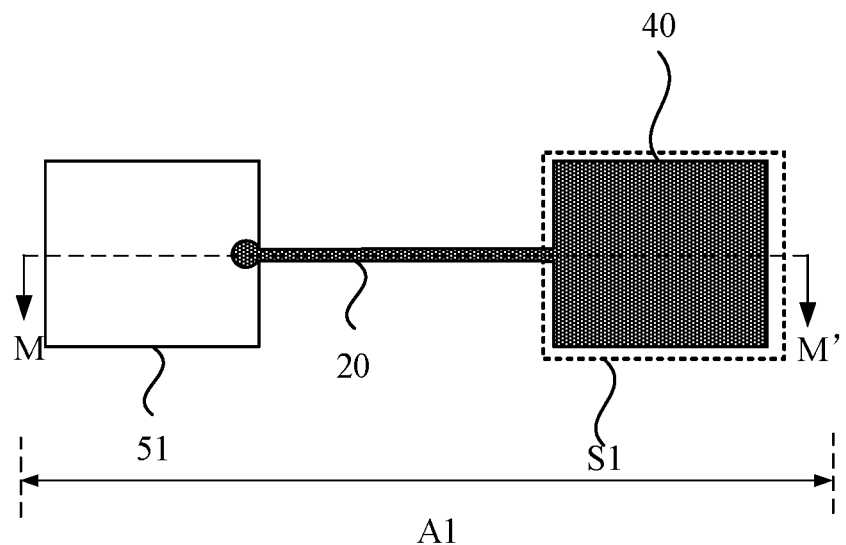
FIG. 22 is another enlarged partial view including the region WW in FIG. 3 according to an embodiment of the present disclosure.
Figure 23:
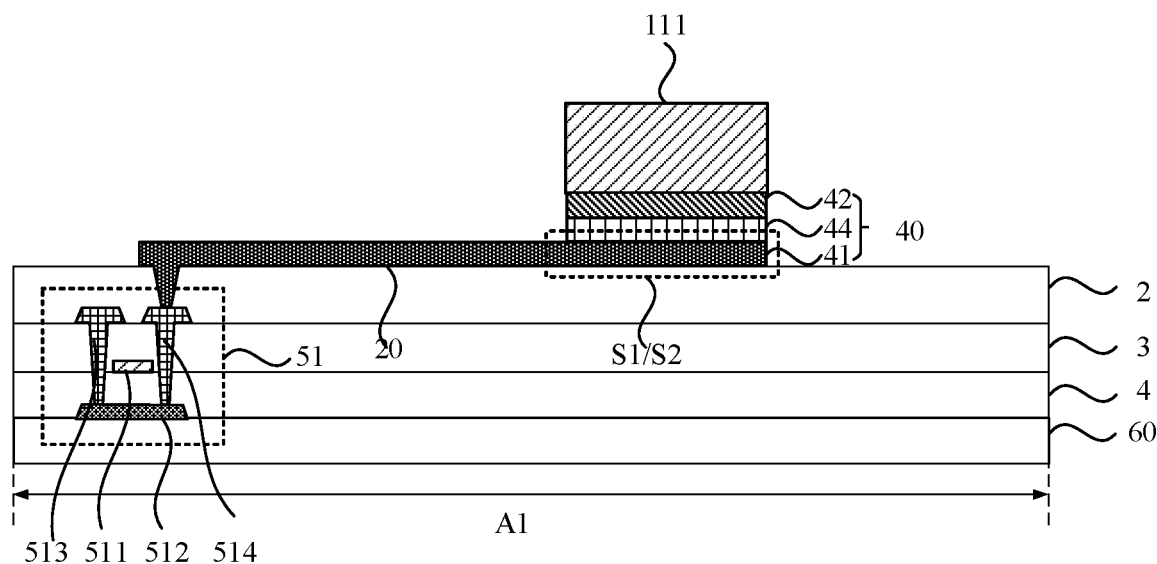
FIG. 23 is a sectional view taken along the direction MM' of FIG. 22 according to an embodiment of the present disclosure.
Figure 24:
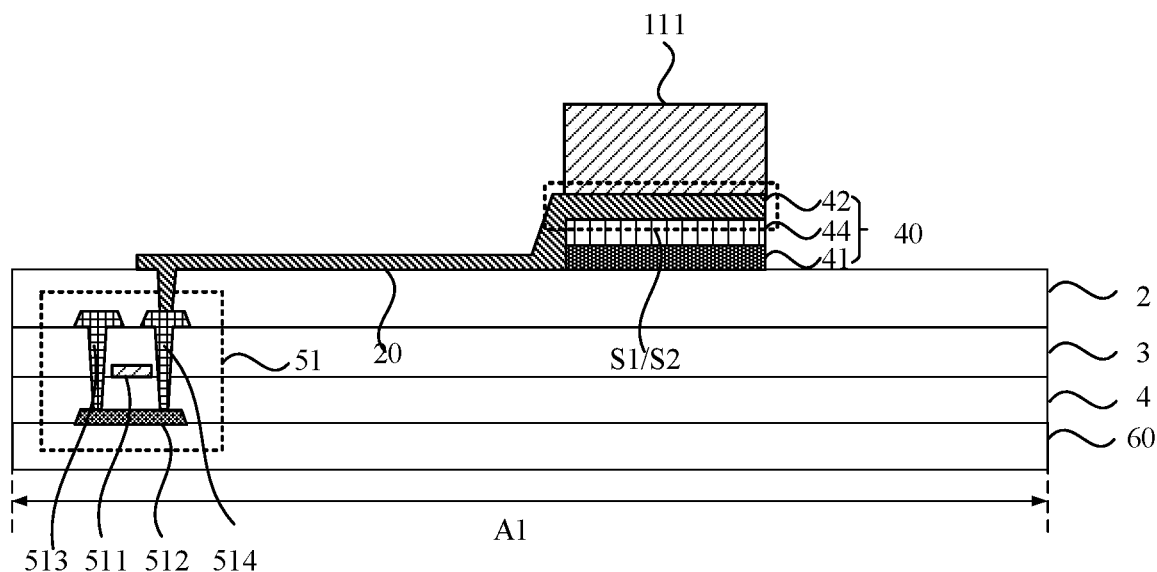
FIG. 24 is another structural view of part of film layers of a display panel according to an embodiment of the present disclosure.
Figure 25:
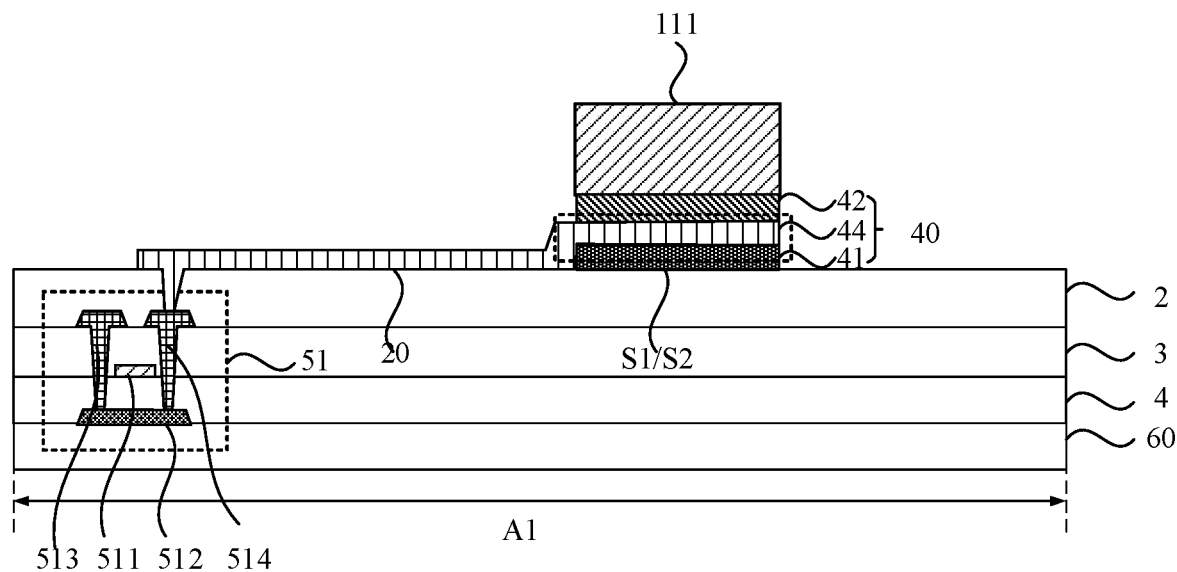
FIG. 25 is another structural view of part of film layers of a display panel according to an embodiment of the present disclosure.
Figure 26:
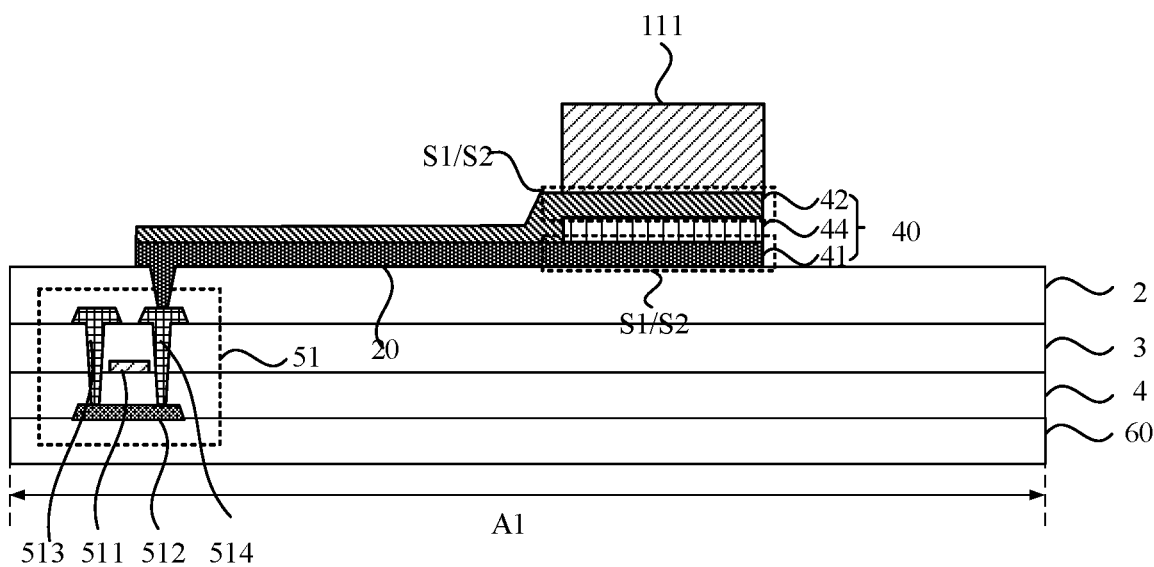
FIG. 26 is another structural view of part of film layers of a display panel according to an embodiment of the present disclosure.

When the anode connecting line segment 20 directly contacts and is electrically connected to the first anode 40, in the direction perpendicular to the substrate 60, the anode connecting line segment 20 may be individually disposed under the first anode 40 such that the anode connecting line segment 20 directly contacts and is electrically connected to the first anode 40, as shown in FIG. 20 or FIG. 21. Alternatively, the anode connecting line segment 20 may be also used as at least one film layer of the first anode 40. Exemplarily, FIG. 22 is another enlarged partial view including the region WW in FIG. 3 according to an embodiment of the present disclosure, and FIG. 23 is a sectional view taken along the direction MM' of FIG. 22 according to an embodiment of the present disclosure. As shown in FIG. 22 and FIG. 23, the first anode 40 includes a first transparent electrode layer 41, a second transparent electrode layer 42, and a first reflective electrode layer 44 located between the first transparent electrode layer 41 and the second transparent electrode layer 42, the anode connecting line segment 20 is also used as the first transparent electrode layer 41. Alternatively, the anode connecting line segment 20 is also used as the second transparent electrode layer 42, as shown in FIG. 24; alternatively, the anode connecting line segment 20 is also used as the first reflective electrode layer 44, as shown in FIG. 25. Alternatively, the first anode 40 includes the first transparent electrode layer 41, and the anode connecting line segment 20 is also used as the first transparent electrode layer 41. Alternatively, the first anode 40 includes the second transparent electrode layer 42, and the anode connecting line segment 20 is also used as the second transparent electrode layer 42. Alternatively, when the first anode 40 includes the first transparent electrode layer 41 and the second transparent electrode layer 42, the anode connecting line segment 20 is also used as one of the first transparent electrode layer 41 or the second transparent electrode layer 42. Alternatively, when the first anode 40 includes the first transparent electrode layer 41 and the second transparent electrode layer 42, the anode connecting line segment 20 is also used as the first transparent electrode layer 41 and the second transparent electrode layer 42, as shown in FIG. 26.

In the implementation, the anode connecting line segment 20 is also used as one film layer of the first anode 40, it is not required to separately set this film layer, so that the number of film layers and the number of corresponding mask plates can be reduced, the manufacturing process of the display panel is reduced, the manufacturing efficiency of the display panel is improved, and meanwhile, the lightness and thinness of the display panel is achieved. Moreover, when the anode connecting line segment 20 is also used as the transparent electrode layer, that is, when the anode connecting line segment 20 is a transparent anode connecting line segment, the position where the anode connecting line segment 20 is disposed can also transmit light, the light transmission area of the optical component region A1 is increased, and more light is transmitted through the optical component region A1 and received by an optical component disposed in the optical component region A1. Therefore, the photosensitivity of the optical component is improved.

Figure 27:
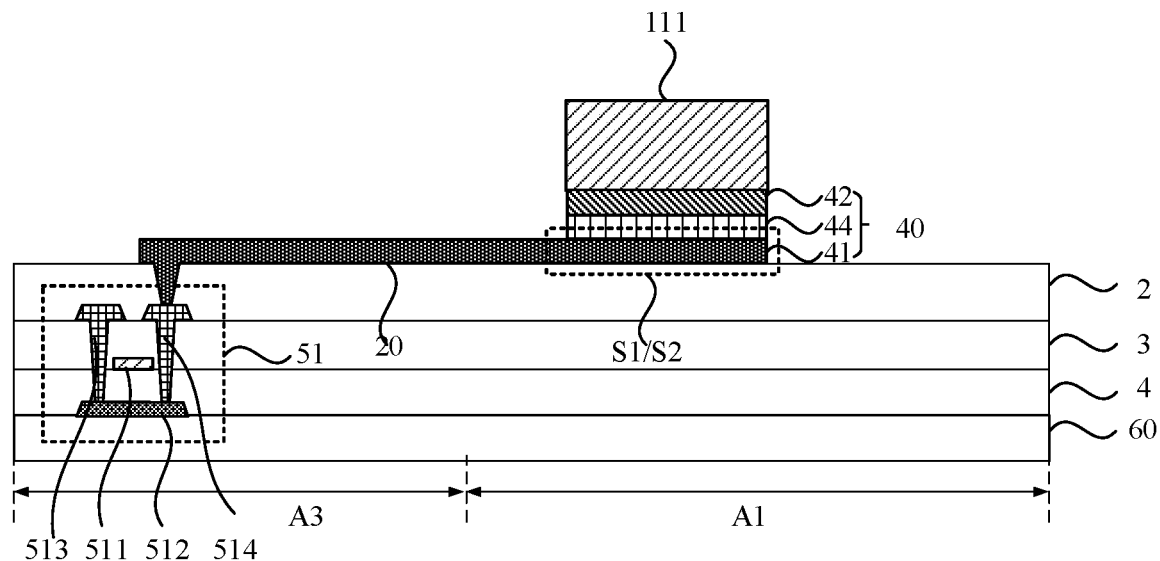
FIG. 27 is another structural view of part of film layers of a display panel according to an embodiment of the present disclosure.

It should be noted that the case where the anode connecting line segment 20 is also used as at least one film layer of the first anode 40 is not only applicable to the case where the first pixel driver circuit 51 is disposed in the optical component region A1, as shown in FIGS. 22 to 26, but also applicable to the case where the first pixel driver circuit is not disposed in the optical component region A1. For example, the first pixel driver circuit 51 is disposed in the second display region A3, as shown in FIG. 27. It should be noted that FIG. 27 illustrates only the example that the anode connecting line segment 20 is also used as the first transparent electrode layer 41 and the first pixel driver circuit 51 is disposed in the second display region A3. The case where the anode connecting line segment 20 is also used as another film layer of the first anode 40 or the case where the anode connecting line segment 20 is also used as at least two film layers of the first anode 40 is also applicable to the case where the first pixel driver circuit 51 is disposed in the second display region A3.

The material of the first transparent electrode layer 41 and the second transparent electrode layer 42 may be, for example, transparent materials such as indium tin oxide (ITO) or indium zinc oxide (IZO).

When the first anode 40 includes the first reflective electrode layer 44, the anode connecting line segment 20 contacts and is electrically connected to the first reflective electrode layer 44, with continued reference to FIGS. 23 and 25, drive signals transmitted by the anode connecting line segment 20 are transmitted to a light-emitting layer of the first light-emitting element 111 through the first reflective electrode layer 44. Meanwhile, the first reflective electrode layer 44 can reflect the light emitted from the first light-emitting element 111 to improve the light utilization rate of the light-emitting element.

Figure 28:
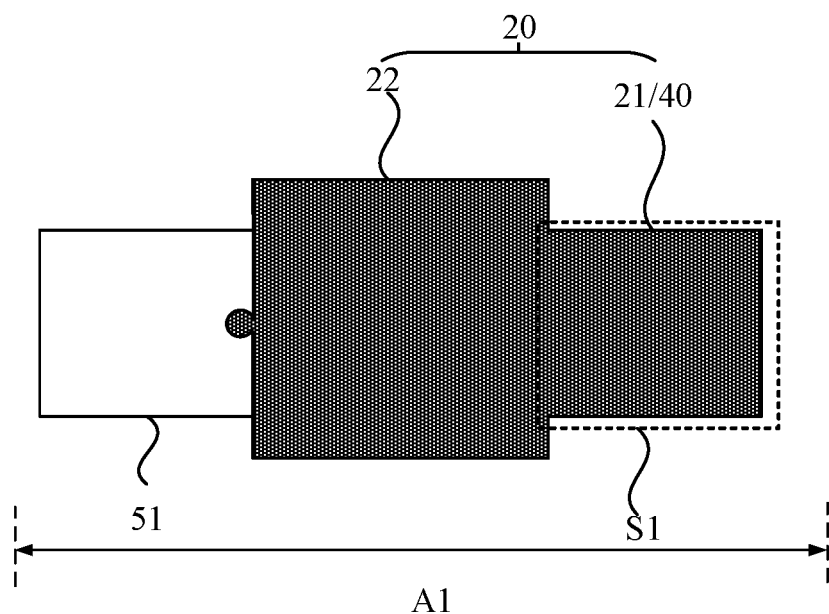
FIG. 28 is another enlarged partial view including the region WW in FIG. 3 according to an embodiment of the present disclosure.

FIG. 28 is another enlarged partial view including the region WW in FIG. 3 according to an embodiment of the present disclosure. As shown in FIG. 28, the anode connecting line segment 20 includes a first subsection 21 and a second subsection 22 connected to each other; and in the direction perpendicular to the plane where the substrate 60 is located, the first subsection 21 at least partially overlaps the first light-emitting element 111, and a line width of the second subsection 22 is greater than a line width of the first subsection 21. In an embodiment, the first subsection 21 is the first anode 40 of the first light-emitting element 111.

In the implementation, the second subsection 22 of the anode connecting line segment 20 may be used for transmitting signals, such as drive signals, and the first subsection 21 may serve as the first anode 40 of the first light-emitting element 111, so that the transmission of the signals can be ensured, and the normal operation of the first light-emitting element 40 can be ensured. Meanwhile, the line width of the second subsection 22 is greater than the line width of the first subsection 21 so that the resistance of the second subsection 22 is reduced, and signals transmitted by the second subsection 22 can be rapidly transmitted to the first subsection 21.

It should be noted that, when the anode connecting line segment 20 includes the first subsection 21 and the second subsection 11 connected to each other, the first pixel driver circuit 51 may be disposed in the optical component region A1 and also be disposed in the second display region A3; meanwhile, when the anode connecting line segment 20 is also used as the first transparent electrode layer 41, the anode connecting line segment 20 includes the first subsection 21 and the second subsection 22 connected to each other; alternatively, the anode connecting line segment 20 may also be used as the second transparent electrode layer 42, alternatively, may also be used as the first transparent electrode layer 41 and the second transparent electrode layer 42.

Figure 29:
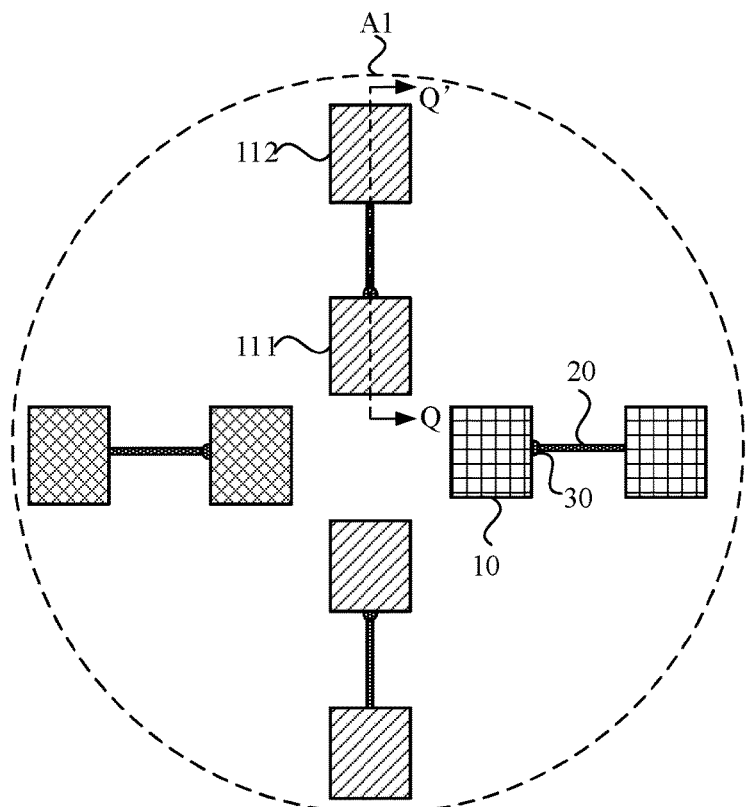
FIG. 29 is another partial top structural view of a display panel according to an embodiment of the present disclosure.
Figure 30:
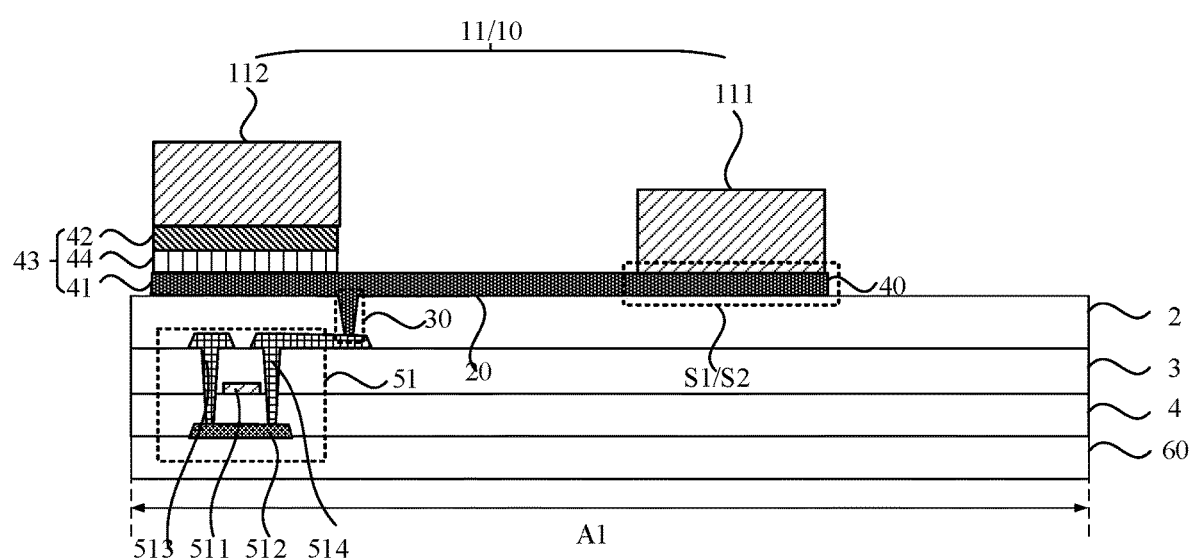
FIG. 30 is a sectional view taken along the direction QQ' of FIG. 29.

FIG. 29 is another partial top structural view of a display panel according to an embodiment of the present disclosure, and FIG. 30 is a sectional view taken along the direction QQ' of FIG. 29. As shown in FIG. 29 and FIG. 30, the first pixel 11 further includes at least one third light-emitting element 112, the at least one third light-emitting element 112 includes a third anode 43, and the third anode 43 is electrically connected to the first pixel driver circuit 51 through a via hole 30. The third anode 43 includes a first reflective electrode layer 44, the first transparent electrode layer 41 and/or the second transparent electrode layer 42.

Figure 31:
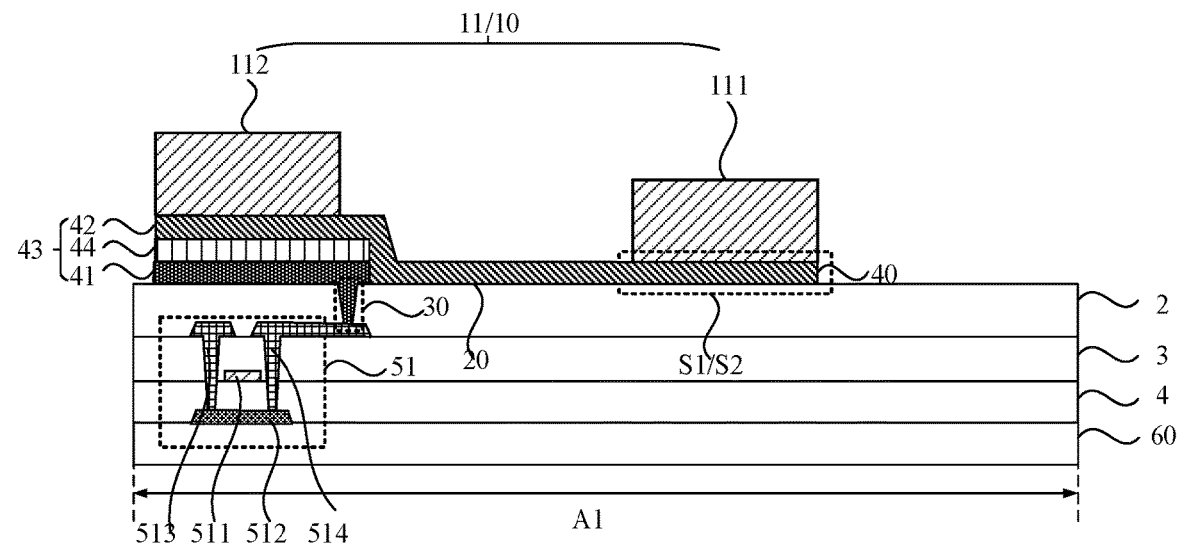
FIG. 31 is another structural view of part of film layers of a display panel according to an embodiment of the present disclosure.

Exemplarily, the third anode 43 includes the first reflective electrode layer 44, the first transparent electrode layer 41 and the second transparent electrode layer 42. With continued reference to FIG. 30, the first transparent electrode layer 41 in the third anode 43 extends to the region where the first light-emitting element 111 is located to serve as the first anode 40 of the first light-emitting element 111 and serve as the anode connecting line segment 20. Alternatively, the second transparent electrode layer 42 in the third anode 43 extends to the region where the first light-emitting element 111 is located to serve as the first anode 40 of the first light-emitting element 111 and serve as the anode connecting line segment 20, as shown in FIG. 31.

Figure 32:
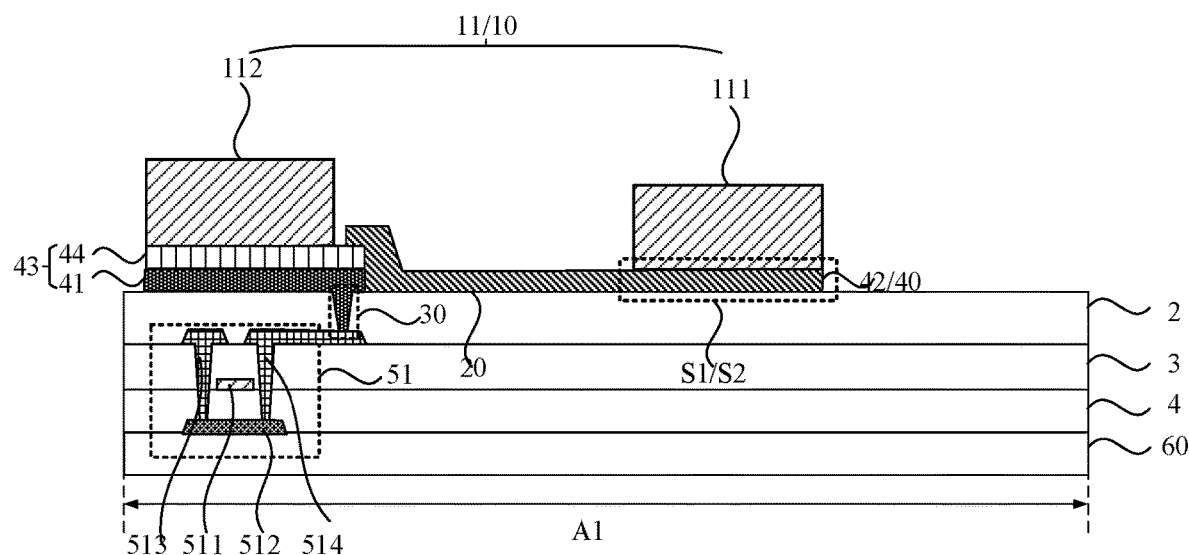
FIG. 32 is another structural view of part of film layers of a display panel according to an embodiment of the present disclosure.

Exemplarily, the third anode 43 includes the first reflective electrode layer 44 and the first transparent electrode layer 41. The second transparent electrode layer 42 serves as the first anode 40 of the first light-emitting element 111 and the anode connecting line segment 20, and the second transparent electrode layer 42 contacts and is electrically connected to the first reflective electrode layer 44 and the first transparent electrode layer 41, as shown in FIG. 32. In an embodiment, the second transparent electrode layer 42 does not serve as part of the third light-emitting element 112.

Figure 33:
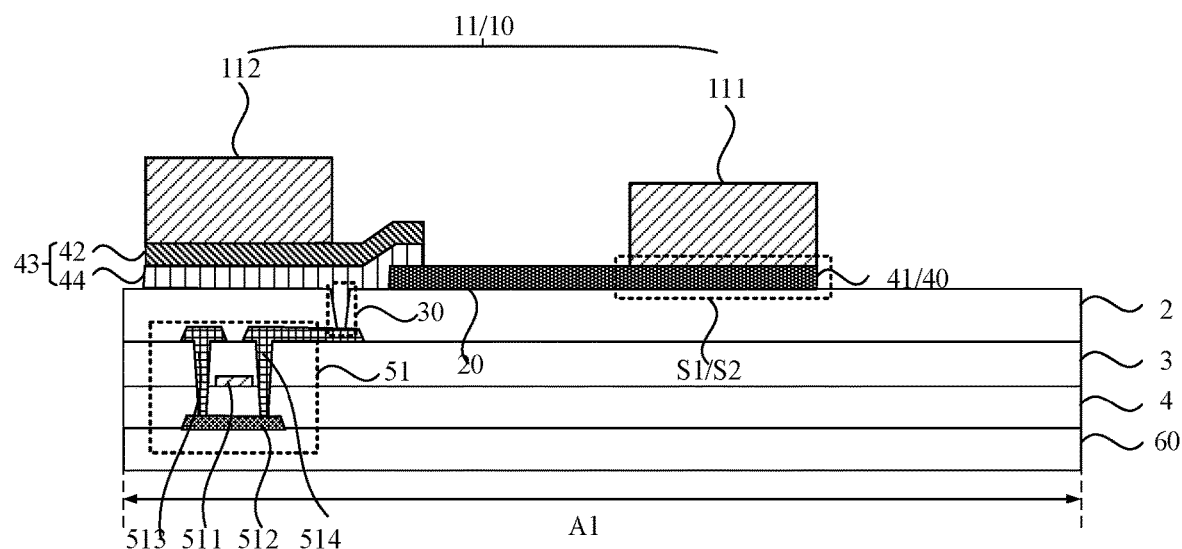
FIG. 33 is another structural view of part of film layers of a display panel according to an embodiment of the present disclosure.

Exemplarily, the third anode 43 includes the first reflective electrode layer 44 and the second transparent electrode layer 42. The first transparent electrode layer 41 serves as the first anode 40 of the first light-emitting element 111 and the anode connecting line segment 20, and the first transparent electrode layer 41 contacts and is electrically connected to the first reflective electrode layer 44 and the second transparent electrode layer 42, as shown in FIG. 33. In an embodiment, the first transparent electrode layer 41 does not serve as part of the third light-emitting element 112.

Figure 34:
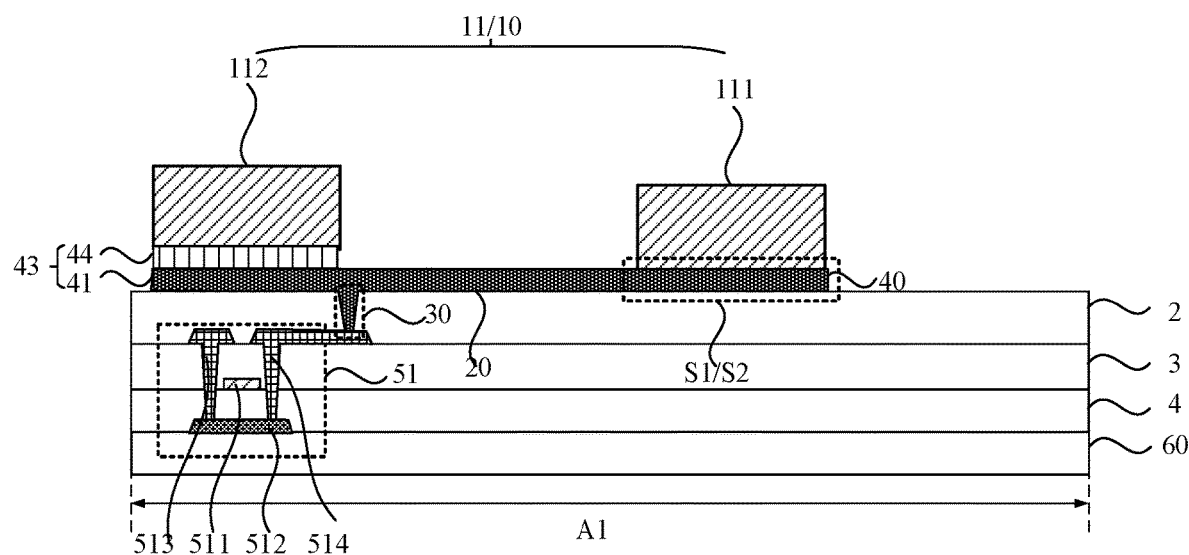
FIG. 34 is another structural view of part of film layers of a display panel according to an embodiment of the present disclosure.

Exemplarily, the third anode 43 includes the first reflective electrode layer 44 and the first transparent electrode layer 41, and the first transparent electrode layer 41 in the third anode 43 extends to the region where the first light-emitting element 111 is located to serve as the first anode 40 of the first light-emitting element 111 and serve as the anode connecting line segment 20, as shown in FIG. 34.

Figure 35:
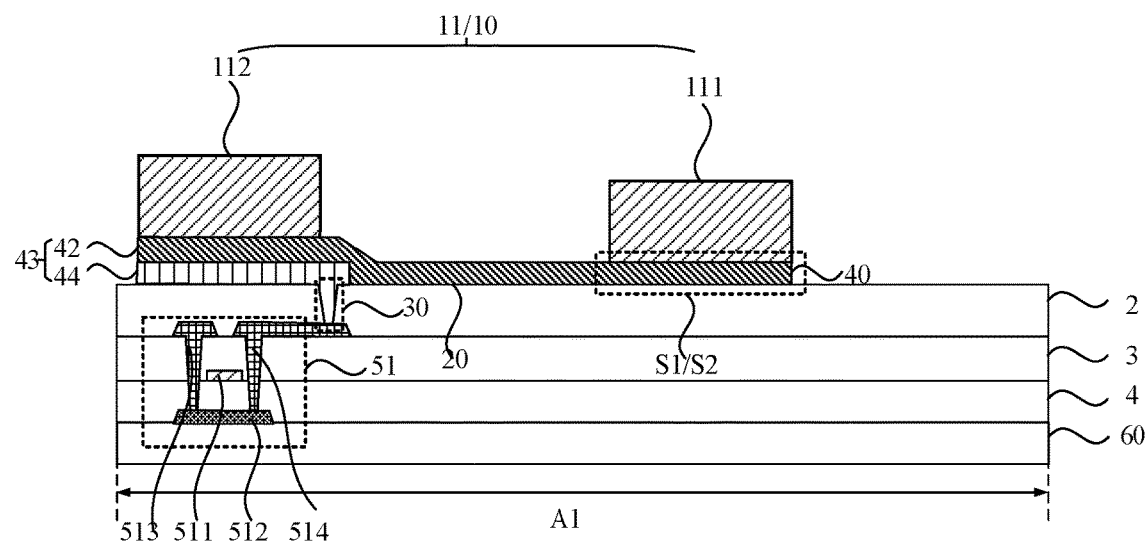
FIG. 35 is another structural view of part of film layers of a display panel according to an embodiment of the present disclosure.

Exemplarily, the third anode 43 includes the first reflective electrode layer 44 and the second transparent electrode layer 42, and the second transparent electrode layer 42 in the third anode 43 extends to the region where the first light-emitting element 111 is located to serve as the first anode 40 of the first light-emitting element 111 and serve as the anode connecting line segment 20, as shown in FIG. 35.

Figure 36:
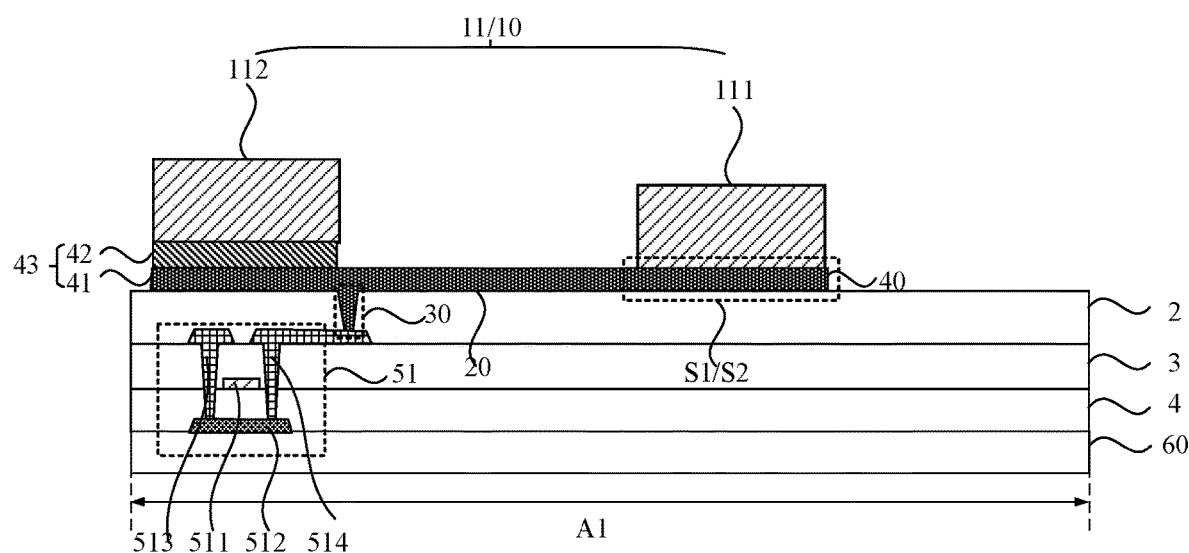
FIG. 36 is another structural view of part of film layers of a display panel according to an embodiment of the present disclosure.
Figure 37:
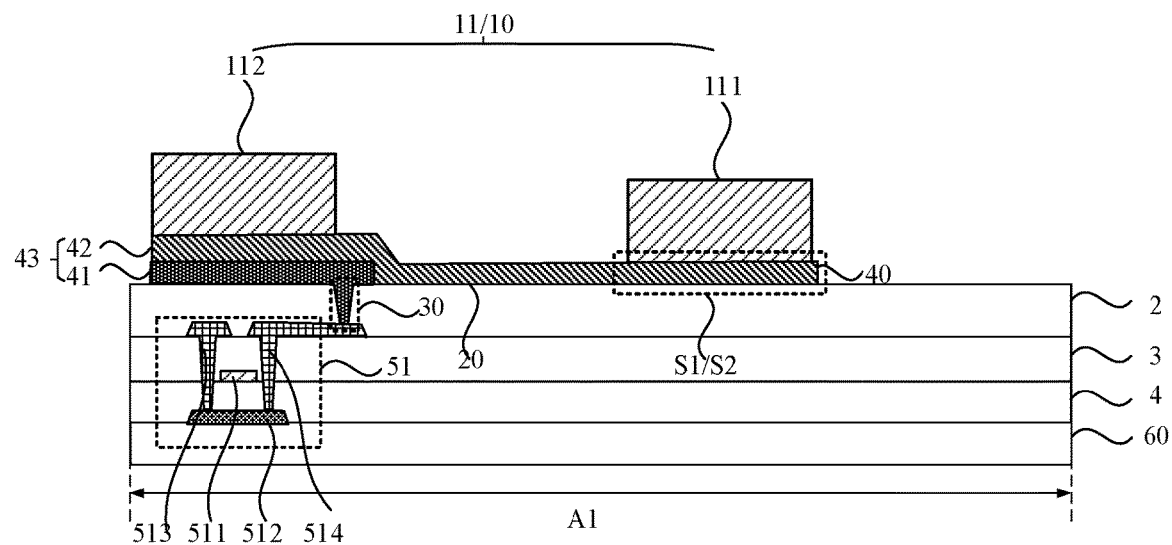
FIG. 37 is another structural view of part of film layers of a display panel according to an embodiment of the present disclosure.
Figure 38:
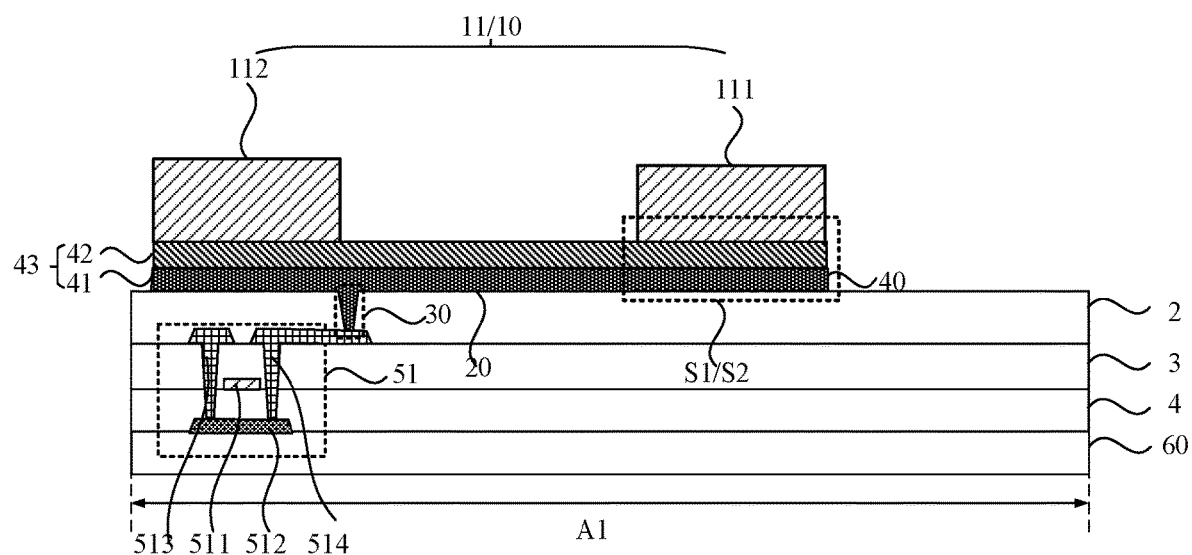
FIG. 38 is another structural view of part of film layers of a display panel according to an embodiment of the present disclosure.

Exemplarily, the third anode 43 includes the first reflective electrode layer 44 and the second transparent electrode layer 42. The first transparent electrode layer 41 in the third anode 43 extends to the region where the first light-emitting element 111 is located to serve as the first anode 40 of the first light-emitting element 111 and serve as the anode connecting line segment 20, as shown in FIG. 36. Alternatively, the second transparent electrode layer 42 in the third anode 43 extends to the region where the first light-emitting element 111 is located to serve as the first anode 40 of the first light-emitting element 111 and serve as the anode connecting line segment 20, as shown in FIG. 37. Alternatively, both the first transparent electrode layer 41 and the second transparent electrode layer 42 in the third anode 43 extend to the region where the first light-emitting element 111 is located to simultaneously serve as the first anode 40 of the first light-emitting element 111 and the anode connecting line segment 20, as shown in FIG. 38.

Figure 39:
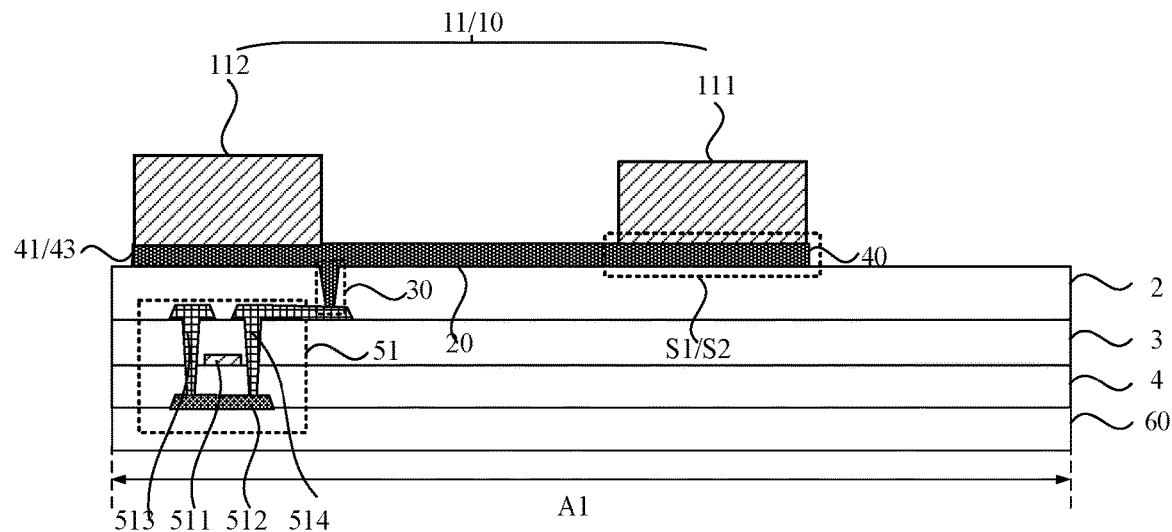
FIG. 39 is another structural view of part of film layers of a display panel according to an embodiment of the present disclosure.

Exemplarily, the third anode 43 includes the first transparent electrode layer 41. The first transparent electrode layer 41 in the third anode 43 extends to the region where the first light-emitting element 111 is located to serve as the first anode 40 of the first light-emitting element 111 and the anode connecting line segment 20, as shown in FIG. 39.

Figure 40:
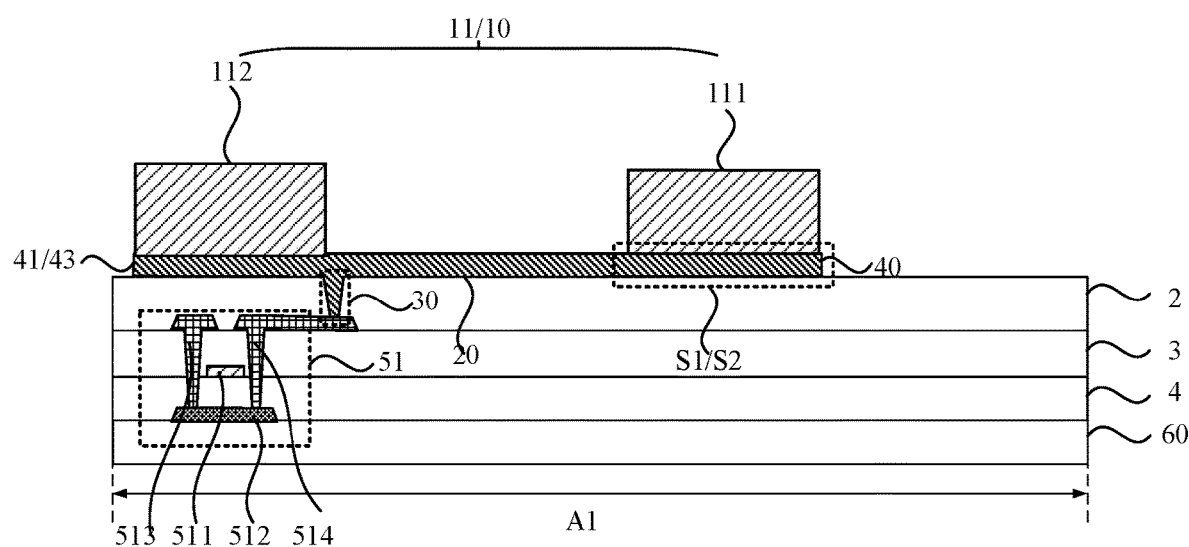
FIG. 40 is another structural view of part of film layers of a display panel according to an embodiment of the present disclosure.

Exemplarily, the third anode 43 includes the second transparent electrode layer 42. The second transparent electrode layer 42 in the third anode 43 extends to the region where the first light-emitting element 111 is located to serve as the first anode 40 of the first light-emitting element 111 and the anode connecting line segment 20, as shown in FIG. 40.

At least one film layer in the third anode 40 may, for example, extend to the region where the first light-emitting element 111 is located to serve as the first anode 40 of the first light-emitting element 111 and the anode connecting line segment 20. In the implementation, one film layer in the third anode 40 serves as the anode connecting line segment 20 and the anode of the first light-emitting element 111 so that the number of film layers and the number of corresponding mask plates can be reduced, the manufacturing process of the display panel is reduced, the manufacturing efficiency of the display panel is improved, and meanwhile, the lightness and thinness of the display panel is achieved. Moreover, the first pixel driver circuit 51 transmits drive signals to the first light-emitting element 111 and the third light-emitting element 112 through the film layer, so that the pixel current of the first pixel 11 can be reduced, and the lifetime of the light-emitting element in the optical component region A1 can be improved.

Figure 41:
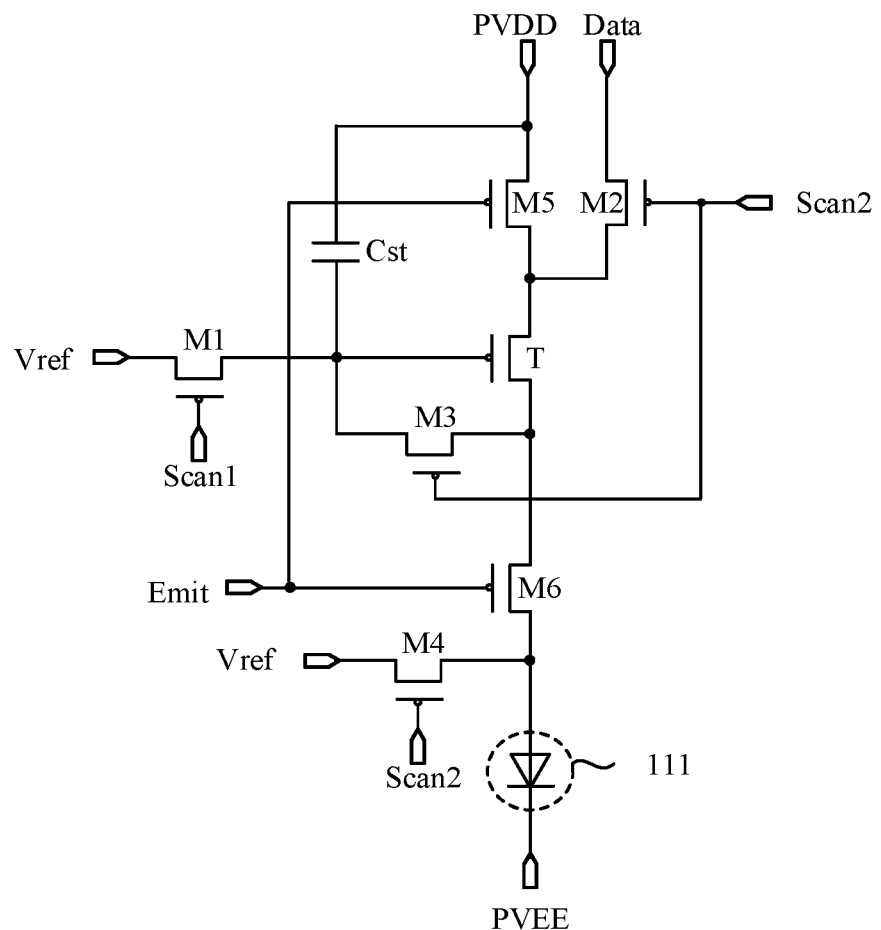
FIG. 41 is a structural view of a pixel driver circuit according to an embodiment of the present disclosure.

On the basis of the above implementations, FIG. 41 is a structural view of a pixel driver circuit according to an embodiment of the present disclosure. As shown in FIG. 41, the first pixel driver circuit 51 provided by the embodiment of the present disclosure includes 7T1C (7 transistors and 1 storage capacitor), that is, the first pixel driver circuit 51 may include a drive transistor T, a data write transistor M2, a threshold compensation transistor M3, reset transistors M4 and M1, light emission control transistors M5 and M6, and a storage capacitor Cst. A first electrode of the light emission control transistor M5 is electrically connected to a first power terminal PVDD, a first electrode of the data write transistor M2 is electrically connected to a data signal terminal Data, a gate electrode of the data write transistor M2 and a gate electrode of the threshold compensation transistor M3 may respectively be electrically connected to a second scan signal terminal Scan2, a first electrode of the reset transistor M4 and a first electrode of the reset transistor M1 are electrically connected to initialization signal terminals Vref (the initialization signal terminals corresponding to the reset transistors M4 and M1 may be the same or different), respectively, a gate electrode of the reset transistor M1 may be electrically connected to a first scan signal terminal Scan1 or the second scan signal terminal Scan2 (only electrically connected to the second scan signal terminal Scan2 is taken as an example in the figure), a gate electrode of the light emission control transistor M5 and a gate electrode of the light emission control transistor M6 may respectively be electrically connected to a light emission control signal terminal Emit, the light emission control transistor M6 is electrically connected to the anode of the first light-emitting element 111, and a cathode of the first light-emitting element 111 is electrically connected to a second power terminal PVEE. The driving principle of the first pixel driver circuit 51 is similar to the driving principle of the 7T1C pixel driver circuit in the related art, which is not repeated herein.

Figure 42:
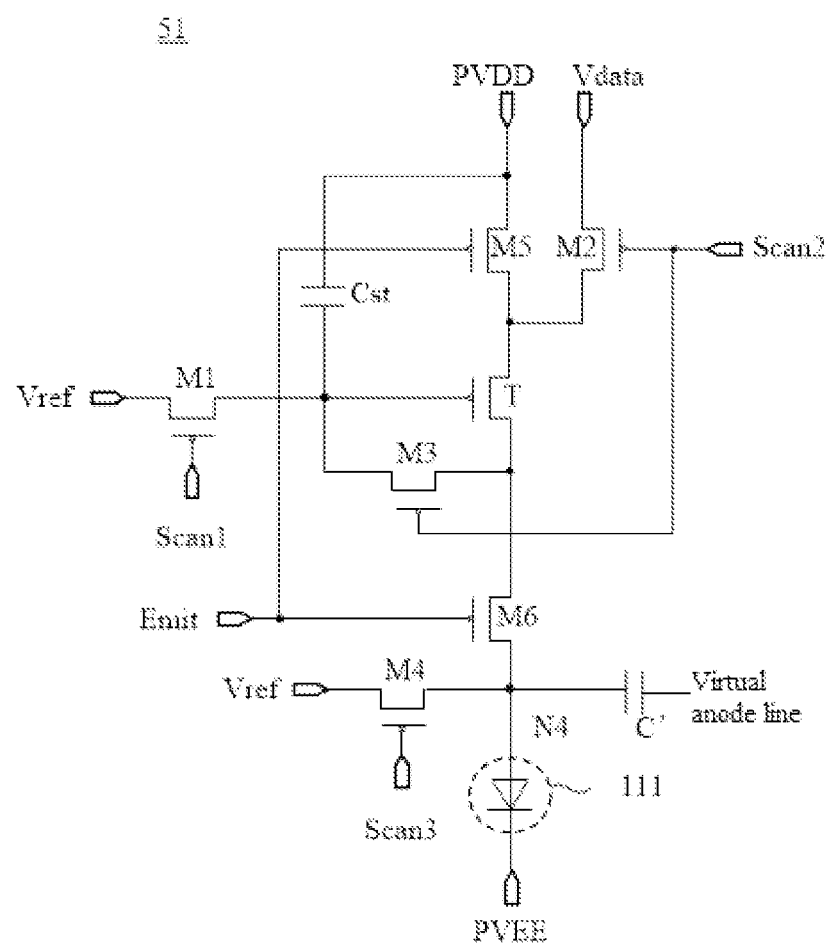
FIG. 42 is another structural view of a pixel driver circuit according to an embodiment of the present disclosure.

It is to be understood that the structure of the first pixel driver circuit 51 includes, but is not limited to, the above examples, and in other alternative embodiments, the first pixel driver circuit 51 may be disposed in other manners as long as the first light-emitting element 111 can be driven to emit light. Exemplarily, FIG. 42 is another structural view of a pixel driver circuit according to an embodiment of the present disclosure. Different from FIG. 41, the display panel further includes a virtual anode line, and the virtual anode line and N4 form a capacitor C'; and the pixel driver circuit includes three scan signal terminals, that is, a first scan signal terminal Scan1, a second scan signal terminal Scan2 and a third scan signal terminal Scan3. The first electrode of the light emission control transistor M5 is electrically connected to the first power terminal PVDD, the first electrode of the data write transistor M2 is electrically connected to the data signal terminal Data, the gate electrode of the data write transistor M2 and the gate electrode of the threshold compensation transistor M3 are electrically connected to the second scan signal terminal Scan2, respectively, the first electrode of the reset transistor M4 and the first electrode of the reset transistor M1 are electrically connected to the initialization signal terminals Vref (the initialization signal terminals corresponding to the reset transistors M4 and M1 may be the same or different), respectively, the gate electrode of the reset transistor M1 is electrically connected to the first scan signal terminal Scan1, the gate electrode of the reset transistor M4 is electrically connected to the third scan signal terminal Scan3, the gate electrode of the light emission control transistor M5 and the gate electrode of the light emission control transistor M6 are electrically connected to the light emission control signal terminal Emit, respectively, and the reset transistor M4 and the light emission control transistor M6 are electrically connected to N4, respectively. N4 is electrically connected to the anode of the first light-emitting element 111, and the cathode of the first light-emitting element 111 is electrically connected to the second power terminal PVEE.

It should be noted that the second pixel driver circuit may be of the same type as the first pixel driver circuit 51 or may be different, which is not limited in the embodiments. In an embodiment, the number of transistors of the first pixel driver circuit may be less than the number of transistors of the second pixel driver circuit.

It should be noted that if not in collision, the structures of the display panel 100 shown in the above figures may be combined or replaced with one another, which is not limited to the embodiments of the present disclosure.

Figure 43:
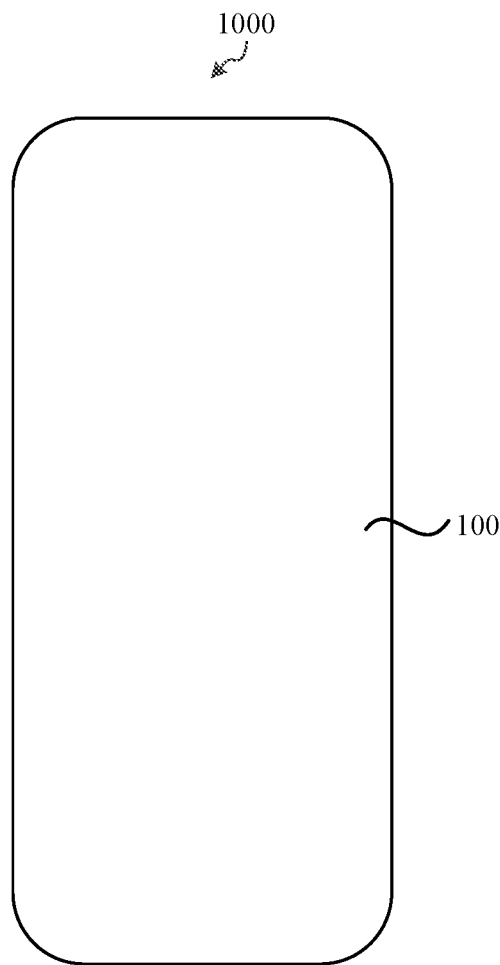
FIG. 43 is a structural view of a display device according to an embodiment of the present disclosure.

Based on the same inventive concept, the embodiments of the present disclosure further provide a display device including the display panel of any one of the embodiments of the present disclosure. FIG. 43 is a structural view of a display device according to an embodiment of the present disclosure. As shown in FIG. 43, the display device 1000 includes the display panel 100 in the above embodiments. Therefore, the display device 1000 provided by the embodiments of the present disclosure also has the beneficial effects described in the above embodiments, which are not repeated herein. Exemplarily, the display device 1000 may be a mobile phone, a computer, a smart wearable device (for example, a smart watch), an onboard display device, and other electronic devices, which is not limited to the embodiments of the present disclosure.

Figure 44:
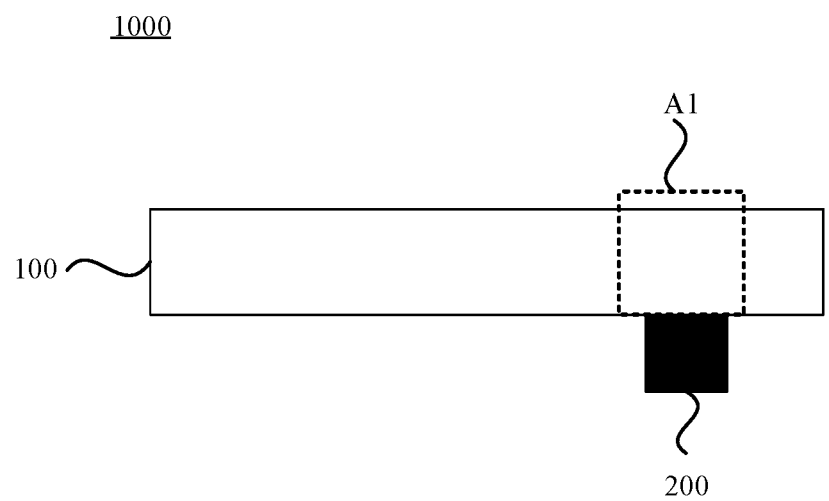
FIG. 44 is a structural view of a film layer of a display device according to an embodiment of the present disclosure.

FIG. 44 is a structural view of a film layer of a display device according to an embodiment of the present disclosure. As shown in FIG. 44, the display device 1000 further includes an optical component 200, and the optical component 200 is disposed to correspond to the optical component region A1.

The optical component 200 includes, for example, a camera disposed to correspond to the optical component region A1.

In an embodiment, the optical component 200 may include, for example, a sensor, and the sensor may include such as a fingerprint recognizer, a light sensor, a distance sensor, and/or an iris recognition sensor, etc. The sensor is disposed to correspond to the optical component region A1.

In an embodiment, when the display region further includes a second display region (not shown in the figures), the camera is disposed to correspond to the optical component region A1, the sensor may be disposed to correspond to the optical component region A1 or disposed to correspond to the second display region.

It is to be noted that the above are only exemplary embodiments of the present disclosure and the principles used therein. It will be understood by those skilled in the art that the present disclosure is not limited to the embodiments described herein. Those skilled in the art can make various apparent variations, adaptions and substitutions without departing from the scope of the present disclosure. Therefore, while the present disclosure has been described in detail via the preceding embodiments, the present disclosure is not limited to the preceding embodiments and may include other equivalent embodiments without departing from the concept of the present disclosure. The scope of the present disclosure is determined by the scope of the appended claims.

What is claimed is:

1. A display panel, comprising:
a display region, wherein the display region comprises an optical component region and a first display region;
a plurality of pixels, wherein the plurality of pixels comprise a first pixel and a second pixel, the first pixel comprises a first light-emitting element, the second pixel comprises a second light-emitting element, the first light-emitting element is located in the optical component region, and the second light-emitting element is located in the first display region;
a plurality of pixel driver circuits, wherein the plurality of pixel driver circuits comprise a first pixel driver circuit and a second pixel driver circuit, the first pixel driver circuit is electrically connected to the first light-emitting element, and the second pixel driver circuit is electrically connected to the second light-emitting element; and
a substrate;
wherein the optical component region comprises an anode connecting line segment, the first light-emitting element comprises a first anode, the anode connecting line segment is electrically connected to the first anode; and in a direction perpendicular to a plane where the substrate is located, an area of the first anode is S1 and an electrical connection area of the first anode and the anode connecting line segment is S2, wherein $5\% \leq S2/S1 \leq 100\%$.

2. The display panel according to claim 1, wherein the first pixel driver circuit is electrically connected to the first anode through the anode connecting line segment.

3. The display panel according to claim 1, wherein the first pixel further comprises at least one third light-emitting element, the at least one third light-emitting element comprises a third anode, and the third anode is electrically connected to the first anode.

4. The display panel according to claim 3, wherein the third anode is electrically connected to the first anode through the anode connecting line segment.

5. The display panel according to claim 2, wherein the display region further comprises a second display region, the second display region is located between the optical component region and the first display region, and the first pixel driver circuit is located in the second display region.

6. The display panel according to claim 3, wherein the display region further comprises a second display region, the second display region is located between the optical component region and the first display region, and the first pixel driver circuit is located in the second display region.

7. The display panel according to claim 6, wherein the third node is located in at least one of the optical component region or the second display region.

8. The display panel according to claim 1, wherein the first pixel driver circuit is located in the optical component region.

9. The display panel according to claim 2, wherein the first pixel driver circuit is located in the optical component region.

10. The display panel according to claim 1, wherein $S2/S1=100\%$.

11. The display panel according to claim 10, wherein the anode connecting line segment is also used as at least one film layer of the first anode.

12. The display panel according to claim 11, wherein the first anode comprises at least one of a first transparent electrode layer or a second transparent electrode layer; and the anode connecting line segment is also used as at least one of the first transparent electrode layer or the second transparent electrode layer.

13. The display panel according to claim 12, wherein the anode connecting line segment comprises a first subsection and a second subsection connected to each other; and in the direction perpendicular to the plane where the substrate is located, the first subsection at least partially overlaps the first light-emitting element, and a line width of the second subsection is greater than a line width of the first subsection.

14. The display panel according to claim 12, wherein the first anode comprises a first reflective electrode layer, and the anode connecting line segment contacts and is electrically connected to the first reflective electrode layer.

15. The display panel according to claim 12, wherein the first pixel further comprises at least one third light-emitting element, the at least one third light-emitting element comprises a third anode, and the third anode is electrically connected to the first pixel driver circuit through a via hole; and the third anode comprises a first reflective electrode layer and at least one of the first transparent electrode layer or the second transparent electrode layer.

16. A display device, comprising a display panel;
wherein the display panel comprises:
a display region, wherein the display region comprises an optical component region and a first display region;
a plurality of pixels, wherein the plurality of pixels comprise a first pixel and a second pixel, the first pixel comprises a first light-emitting element, the second pixel comprises a second light-emitting element, the first light-emitting element is located in the optical component region, and the second light-emitting element is located in the first display region;
a plurality of pixel driver circuits, wherein the plurality of pixel driver circuits comprise a first pixel driver circuit and a second pixel driver circuit, the first pixel driver circuit is electrically connected to the first light-emitting element, and the second pixel driver circuit is electrically connected to the second light-emitting element; and a substrate;

wherein the optical component region comprises an anode connecting line segment, the first light-emitting element comprises a first anode, the anode connecting line segment is electrically connected to the first anode; and in a direction perpendicular to a plane where the substrate is located, an area of the first anode is S1 and an electrical connection area of the first anode and the anode connecting line segment is S2, wherein 5%<S2/S1≤100%.

17. The display device according to claim 16, further comprising an optical component; wherein the optical component is disposed to correspond to the optical component region.

18. The display device according to claim 16, wherein the first pixel driver circuit is electrically connected to the first anode through the anode connecting line segment.

19. The display device according to claim 16, wherein the first pixel further comprises at least one third light-emitting element, the at least one third light-emitting element comprises a third anode, and the third anode is electrically connected to the first anode.

20. The display device according to claim 16, wherein S2/S1=100%.

* * * * *